US010983185B2

(12) United States Patent
Stack et al.

(10) Patent No.: US 10,983,185 B2
(45) Date of Patent: Apr. 20, 2021

(54) RF COIL ARRAY FOR AN MRI SYSTEM

(71) Applicant: General Electric Company, Schenectady, NY (US)

(72) Inventors: Ceara Delmore Stack, Ravenna, OH (US); Fraser John Laing Robb, Aurora, OH (US); Victor Taracila, Beachwood, OH (US); Robert Steven Stormont, Hartland, WI (US); Luke Charles Smith, Saint Clairsville, OH (US)

(73) Assignee: General Electric Company, Schenectady, NY (US)

(*) Notice: Subject to any disclaimer, the term of this patent is extended or adjusted under 35 U.S.C. 154(b) by 159 days.

(21) Appl. No.: 16/191,827

(22) Filed: Nov. 15, 2018

(65) Prior Publication Data

US 2019/0154773 A1 May 23, 2019

Related U.S. Application Data

(60) Provisional application No. 62/590,248, filed on Nov. 22, 2017.

(51) Int. Cl.
*G01R 33/3415* (2006.01)
*G01R 33/48* (2006.01)
(Continued)

(52) U.S. Cl.
CPC ... *G01R 33/3415* (2013.01); *G01R 33/34007* (2013.01); *G01R 33/34084* (2013.01);
(Continued)

(58) Field of Classification Search
CPC .......... G01R 33/3415; G01R 33/34007; G01R 33/34084; G01R 33/3685; G01R 33/48; G01R 33/3657
(Continued)

(56) References Cited

U.S. PATENT DOCUMENTS 4,621,237 A * 11/1986 Timms ................. G01R 33/341
324/318
4,835,472 A * 5/1989 Zabel ................... G01R 33/341
324/318
(Continued)

FOREIGN PATENT DOCUMENTS

CN 206023716 U * 3/2017
CN 106646294 A * 5/2017
(Continued)

OTHER PUBLICATIONS

Espacenet—Bibliographic Data : CN2060023716(U)—2020—See English Abstract (Year: 2020).*
(Continued)

*Primary Examiner* — Dixomara Vargas
*Assistant Examiner* — Sean Curtis

(57) ABSTRACT

Methods and systems are provided for radio frequency (RF) coils for magnetic resonance imaging (MRI) systems. In one embodiment, a system comprises: a radio frequency (RF) coil array for a magnetic resonance imaging (MRI) system, including: a flexible shell including an inner layer; and a plurality of flexible RF coils embedded within the inner layer, with each RF coil of the plurality of RF coils including two distributed capacitance wire conductors. In this way, the RF coil array may deform in order to conform to a body of a patient.

18 Claims, 15 Drawing Sheets

(51) Int. Cl.
*G01R 33/34* (2006.01)
*G01R 33/36* (2006.01)
(52) U.S. Cl.
CPC ......... *G01R 33/3685* (2013.01); *G01R 33/48* (2013.01); *G01R 33/3657* (2013.01)
(58) Field of Classification Search
USPC .................................................. 324/300–322
See application file for complete search history.

(56) References Cited

U.S. PATENT DOCUMENTS

| | | | | |
|---|---|---|---|---|
| 4,881,034 | A * | 11/1989 | Kaufman | G01R 33/3415 324/318 |
| 5,435,302 | A * | 7/1995 | Lenkinski | G01R 33/34 324/318 |
| 5,548,218 | A * | 8/1996 | Lu | G01R 33/34 324/318 |
| 5,619,996 | A * | 4/1997 | Beresten | G01R 33/34046 324/318 |
| 6,029,082 | A * | 2/2000 | Srinivasan | G01R 33/34046 324/318 |
| 6,150,816 | A * | 11/2000 | Srinivasan | G01R 33/3415 324/318 |
| 6,727,698 | B1 * | 4/2004 | Eydelman | G01R 33/34053 324/318 |
| 6,836,117 | B2 * | 12/2004 | Tamura | G01R 33/3678 324/318 |
| 6,847,210 | B1 * | 1/2005 | Eydelman | G01R 33/341 324/318 |
| 6,980,000 | B2 * | 12/2005 | Wong | G01R 33/34053 324/318 |
| 7,619,416 | B2 | 11/2009 | Nordmeyer-Massner et al. | |
| 7,663,367 | B2 * | 2/2010 | Wiggins | A61B 5/055 324/318 |
| 8,035,385 | B2 * | 10/2011 | Tomiha | G01R 33/34076 324/318 |
| 8,269,498 | B2 * | 9/2012 | Zhang | G01R 33/3415 324/318 |
| 8,598,880 | B2 * | 12/2013 | Dalveren | G01R 33/34084 324/318 |
| 9,000,766 | B2 * | 4/2015 | Chu | G01R 33/34084 324/318 |
| 9,002,431 | B2 * | 4/2015 | Jones | G01R 33/34007 600/421 |
| 9,157,971 | B2 * | 10/2015 | Shah | G01R 33/34076 |
| 9,316,709 | B2 * | 4/2016 | Hetherington | G01R 33/3635 |
| 9,581,662 | B2 * | 2/2017 | Maciejewski | G01R 33/30 |
| 9,632,152 | B2 * | 4/2017 | Lee | G01R 33/3415 |
| 9,678,180 | B2 | 6/2017 | Yang et al. | |
| 9,689,939 | B2 * | 6/2017 | Potter | G01R 33/3635 |
| 9,804,237 | B2 | 10/2017 | Driemel | |
| 9,829,551 | B2 * | 11/2017 | Kawai | G01R 33/365 |
| 9,846,207 | B2 * | 12/2017 | Dumoulin | G01R 33/34007 |
| 9,891,299 | B1 * | 2/2018 | Stormont | G01R 33/3873 |
| 9,927,504 | B2 * | 3/2018 | Tomiha | G01R 33/36 |
| 10,132,883 | B2 * | 11/2018 | Chu | G01R 33/34084 |
| 10,281,537 | B2 * | 5/2019 | Tomiha | G01R 33/36 |
| 10,295,625 | B2 * | 5/2019 | Okamoto | G01R 33/3692 |
| 10,466,320 | B2 * | 11/2019 | Saha | G01R 33/341 |
| 10,488,475 | B2 * | 11/2019 | Ha | G01R 33/3607 |
| 10,520,563 | B2 * | 12/2019 | Gruber | H01F 6/06 |
| 10,670,674 | B2 * | 6/2020 | Okamoto | G01R 33/3664 |
| 2004/0162583 | A1 * | 8/2004 | Bingham | A61N 1/403 607/3 |
| 2004/0217761 | A1 * | 11/2004 | Wong | G01R 33/34053 324/318 |
| 2008/0204021 | A1 * | 8/2008 | Leussler | G01R 33/3415 324/318 |
| 2008/0284435 | A1 * | 11/2008 | Overweg | G01R 33/341 324/318 |
| 2009/0134875 | A1 * | 5/2009 | Tomiha | G01R 33/28 324/318 |
| 2009/0174407 | A1 * | 7/2009 | Han | G01R 33/3403 324/318 |
| 2009/0276169 | A1 * | 11/2009 | Walsh | G01R 33/10 702/57 |
| 2012/0086452 | A1 * | 4/2012 | Dohata | G01R 33/3456 324/318 |
| 2012/0112748 | A1 * | 5/2012 | Hetherington | G01R 33/3635 324/318 |
| 2012/0153955 | A1 * | 6/2012 | Wong | G01R 33/34076 324/322 |
| 2013/0009644 | A1 * | 1/2013 | Kawai | G01R 33/365 324/322 |
| 2013/0093425 | A1 * | 4/2013 | Chu | G01R 33/365 324/318 |
| 2013/0119991 | A1 * | 5/2013 | Soutome | A61B 5/055 324/322 |
| 2013/0187651 | A1 * | 7/2013 | Konta | G01R 33/56383 324/309 |
| 2013/0234713 | A1 * | 9/2013 | Maciejewski | G01R 33/30 324/321 |
| 2013/0317346 | A1 * | 11/2013 | Alagappan | G01R 33/34084 600/415 |
| 2013/0320981 | A1 * | 12/2013 | Bulumulla | G01R 33/34007 324/318 |
| 2013/0335086 | A1 * | 12/2013 | Shah | G01R 33/34007 324/322 |
| 2014/0070811 | A1 * | 3/2014 | Tomiha | G01R 33/36 324/322 |
| 2014/0159727 | A1 * | 6/2014 | Lee | G01R 33/34092 324/322 |
| 2014/0197833 | A1 * | 7/2014 | Ryu | G01R 33/341 324/309 |
| 2014/0210466 | A1 * | 7/2014 | Arias | G01R 33/34084 324/309 |
| 2014/0275965 | A1 * | 9/2014 | Majewski | G01R 33/481 600/411 |
| 2015/0173678 | A1 * | 6/2015 | Jones | G01R 33/34 600/421 |
| 2016/0154074 | A1 * | 6/2016 | Okamoto | G01R 33/3692 324/322 |
| 2016/0291100 | A1 * | 10/2016 | Ha | G01R 33/3607 |
| 2017/0343625 | A1 * | 11/2017 | Chu | H01F 7/202 |
| 2017/0359034 | A1 * | 12/2017 | Hussein | H03F 3/245 |
| 2018/0045794 | A1 * | 2/2018 | Wiggins | G01R 33/34 |
| 2018/0180691 | A1 * | 6/2018 | Tomiha | G01R 33/36 |
| 2018/0275234 | A1 * | 9/2018 | Han | A61B 5/4312 |
| 2018/0329005 | A1 * | 11/2018 | Sodickson | G01R 33/3621 |
| 2019/0056466 | A1 * | 2/2019 | Chu | G01R 33/34084 |
| 2019/0154772 | A1 * | 5/2019 | Ham | G01R 33/3804 |
| 2019/0154773 | A1 * | 5/2019 | Stack | G01R 33/34084 |
| 2019/0154774 | A1 * | 5/2019 | Hushek | G01R 33/3657 |
| 2019/0154775 | A1 * | 5/2019 | Stack | G01R 33/34084 |
| 2019/0227135 | A1 * | 7/2019 | Okamoto | G01R 33/3664 |
| 2019/0277926 | A1 * | 9/2019 | Stormont | G01R 33/54 |
| 2019/0310327 | A1 * | 10/2019 | Stormont | G01R 33/3621 |
| 2019/0310328 | A1 * | 10/2019 | Fuqua | G01R 33/3657 |
| 2019/0310329 | A1 * | 10/2019 | Malik | G01R 33/3621 |
| 2019/0310330 | A1 * | 10/2019 | Yang | G01R 33/36 |
| 2019/0353722 | A1 * | 11/2019 | Stormont | A61B 5/6803 |
| 2019/0369176 | A1 * | 12/2019 | Dalveren | G01R 33/34084 |
| 2019/0369180 | A1 * | 12/2019 | Chang | G01R 33/3664 |
| 2019/0377040 | A1 * | 12/2019 | Stack | A61B 5/055 |
| 2020/0072921 | A1 * | 3/2020 | Che | G01R 33/3628 |
| 2020/0081080 | A1 * | 3/2020 | Zemskov | G01R 33/3403 |
| 2020/0158800 | A1 * | 5/2020 | Taracila | G01R 33/3628 |
| 2020/0271738 | A1 * | 8/2020 | Qin | A61B 5/055 |

FOREIGN PATENT DOCUMENTS

| | | | |
|---|---|---|---|
| EP | 0918228 A2 * | 5/1999 | ....... G01R 33/34046 |
| EP | 3545322 A1 * | 10/2019 | .......... G01R 33/341 |
| WO | WO-2018098355 A1 * | 5/2018 | ........ G01R 33/3415 |

OTHER PUBLICATIONS

Corea et al., "Screen-printed flexible MRI receive coils," Nature Communications, Published Mar. 10, 2016, 7 pages.

(56) References Cited

OTHER PUBLICATIONS

Zhang et al., "High Impedance Detector Arrays for Magnetic Resonance." arXiv:1709.03416v1, physics.ins-det, Sep. 11, 2017, 16 pages.

\* cited by examiner

RF COIL ARRAY FOR AN MRI SYSTEM

CROSS REFERENCE

This application claims benefit and priority to U.S. Provisional Application No. 62/590,248 filed on Nov. 22, 2017, the entirety of which is incorporated herein by reference.

FIELD

Embodiments of the subject matter disclosed herein relate to magnetic resonance imaging (MRI), and more particularly, to radio frequency (RF) coils for MRI systems.

BACKGROUND

Magnetic resonance imaging (MRI) is a medical imaging modality that can produce images of an interior of a patient without x-ray radiation or other types of ionizing radiation. An MRI system is a medical imaging device utilizing a superconducting magnet to create a strong, uniform, static magnetic field within a designated region (e.g., within a passage shaped to receive a patient). When a body of a patient (or portion of the body of the patient) is positioned within the magnetic field, nuclear spins associated with the hydrogen nuclei that form water within tissues of the patient become polarized. The magnetic moments associated with these spins become aligned along the direction of the magnetic field and result in a small net tissue magnetization in the direction of the magnetic field. MRI systems additionally include magnetic gradient coils that produce spatially-varying magnetic fields of smaller magnitudes relative to a magnitude of the uniform magnetic field resulting from the superconducting magnet. The spatially-varying magnetic fields are configured to be orthogonal to each other in order to spatially encode the region by creating a signature resonance frequency of the hydrogen nuclei at different locations in the body of the patient. Radio frequency (RF) coil assemblies are then used to create pulses of RF energy at or near the resonance frequency of the hydrogen nuclei. The pulses of RF energy are absorbed by the hydrogen nuclei, thereby adding energy to the nuclear spin system and adjusting the hydrogen nuclei from a rest state to an excited state. As the hydrogen nuclei relax back to the rest state from the excited state, they release the absorbed energy in the form of an RF signal. This signal is detected by the MRI system and is transformed into an image using reconstruction algorithms.

In order to detect the RF signals emitted by the body of the patient, a local RF coil assembly (which may be referred to as an RF coil array) is often positioned proximate to one or more anatomical features to be imaged by the MRI system. An image quality of images produced by the MRI system is dependent on a distance of the local RF coil assembly from the origin of the signals received by the local RF coil assembly (such as the one or more anatomical features).

BRIEF DESCRIPTION

In one embodiment, a system comprises: a radio frequency (RF) coil array for a magnetic resonance imaging (MRI) system, including: a flexible shell including an inner layer; and a plurality of flexible RF coils embedded within the inner layer, with each RF coil of the plurality of RF coils including at least two distributed capacitance wire conductors. In this way, the RF coil array may conform to a body of a patient in order to position the plurality of RF coils closer to the body, increasing an imaging quality of the RF coil array.

It should be understood that the brief description above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

The present invention will be better understood from reading the following description of non-limiting embodiments, with reference to the attached drawings, wherein below:

FIGS. 3-6 are shown to scale, though other relative dimensions may be used, if desired.

DETAILED DESCRIPTION

The following description relates to various embodiments of a radio frequency (RF) coil in magnetic resonance imaging (MRI) systems. In particular, systems and methods are provided for a flexible RF coil array including a plurality of flexible RF coils. The RF coils are effectively transparent to other RF coils in the RF coil array, due to minimization of magnetic and electric coupling mechanisms. The flexibility of the RF coil array enables the RF coils to be positioned closer to a body of a patient imaged by an MRI system, increasing an RF signal-receiving quality of the RF coil array and increasing a quality of images produced by the MRI system.

Figure 1:
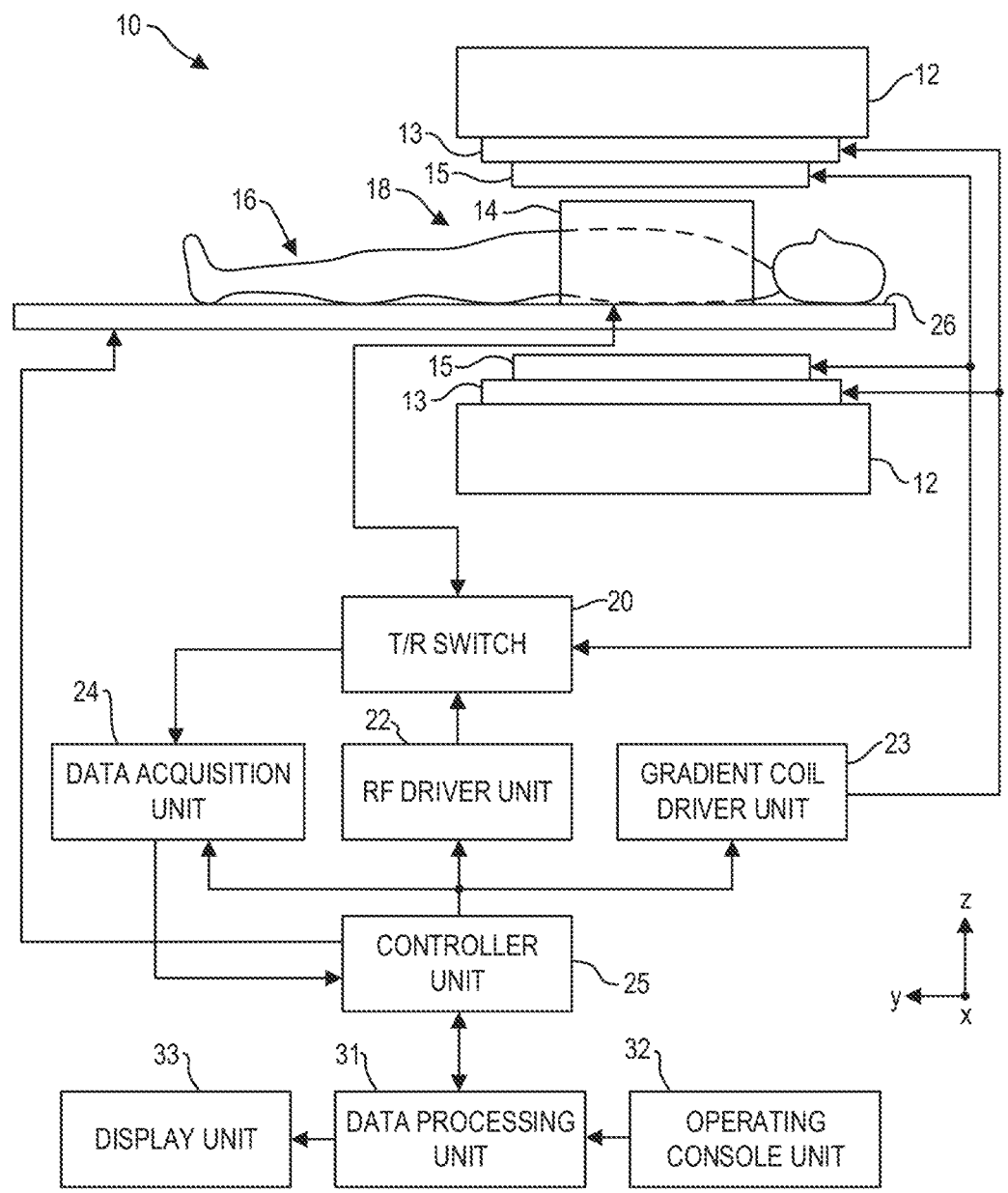
FIG. 1 schematically shows an MRI system including at least one RF coil, according to an embodiment.
Figure 2:
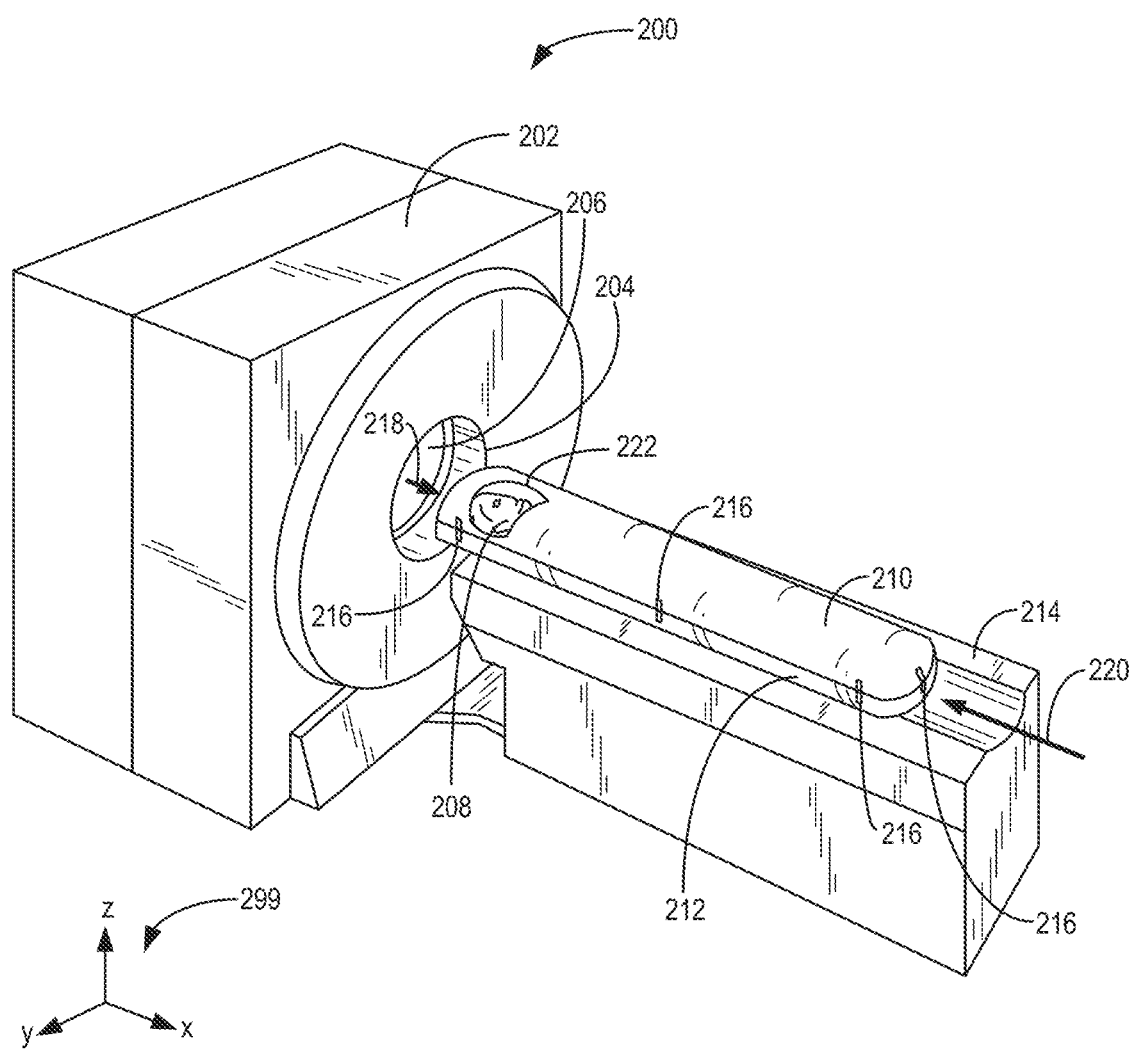
FIG. 2 shows a perspective view of an MRI system including first and second RF coil arrays, according to an embodiment.

For example, an MRI system, such as the MRI systems shown by FIGS. 1-2, may include an RF coil array having a plurality of flexible RF coils embedded therein, such as the RF coil arrays shown by FIGS. 3-6. In some examples, the RF coils are embedded in an inner layer of the RF coil array, with the inner layer being disposed adjacent to an outer chamber of the RF coil array. As described with regard to the method illustrated by FIG. 7, a pressure of gases within the outer chamber may be adjusted (e.g., decreased or increased) in order to adjust the RF coil array to conform the RF coil array to the body of the patient. The flexible RF coils embedded within the RF coil array may deform (e.g., bend, fold, etc.) with the RF coil array as the RF coil array is shaped to the patient in order to reduce a distance between the patient and the RF coils. The RF coils are configured with coupling electronics and distributed capacitance wire conductors, as described with reference to FIGS. 8-14, such that each RF coil is transparent to each other RF coil. In this way, as the RF coil array is positioned against the body of the patient and/or conforms to the patient, the RF coils may move relative to each other and/or deform without degradation of MR signals transmitted to the MRI system by the RF coils of the RF coil array.

FIG. 1 illustrates a magnetic resonance imaging (MRI) apparatus 10 that includes a superconducting field magnet unit 12, a gradient coil unit 13, an RF coil unit 14, an RF body or volume coil unit 15, a transmit/receive (T/R) switch 20, an RF driver unit 22, a gradient coil driver unit 23, a data acquisition unit 24, a controller unit 25, a patient table or bed 26, a data processing unit 31, an operating console unit 32, and a display unit 33. In one example, the RF coil unit 14 is a surface coil, which is a local coil that is typically placed proximate to the anatomy of interest of a subject 16 (e.g., a patient). Herein, the RF body coil unit 15 is a transmit coil that transmits RF signals, and the local surface RF coil unit 14 receives the MR signals. As such, the transmit body coil (e.g., RF body coil unit 15) and the surface receive coil (e.g., RF coil unit 14) are independent but electromagnetically coupled structures. The MRI apparatus 10 transmits electromagnetic pulse signals to the subject 16 placed in an imaging space 18 with a static magnetic field formed to perform a scan for obtaining magnetic resonance signals from the subject 16 to reconstruct an image of a slice of the subject 16 based on the magnetic resonance signals thus obtained by the scan.

The superconducting magnet unit 12 includes, for example, an annular superconducting magnet, which is mounted within a toroidal vacuum vessel. The magnet defines a cylindrical space surrounding the subject 16, and generates a constant, strong, uniform, static magnetic along the Z direction of the cylindrical space.

The MRI apparatus 10 also includes the gradient coil unit 13 that generates a gradient magnetic field in the imaging space 18 so as to provide the magnetic resonance signals received by the RF coil unit 14 with three-dimensional positional information. The gradient coil unit 13 includes three gradient coil systems, each of which generates a gradient magnetic field, which inclines into one of three spatial axes perpendicular to each other, and generates a gradient magnetic field in each of frequency encoding direction, phase encoding direction, and slice selection direction in accordance with the imaging condition. More specifically, the gradient coil unit 13 applies a gradient magnetic field in the slice selection direction of the subject 16, to select the slice; and the RF body coil unit 15 transmits an RF signal to a selected slice of the subject 16 and excites it. The gradient coil unit 13 also applies a gradient field in the phase encoding direction of the subject 16 to phase encode the magnetic resonance signals from the slice excited by the RF signal. The gradient coil unit 13 then applies a gradient magnetic field in the frequency encoding direction of the subject 16 to frequency encode the magnetic resonance signals from the slice excited by the RF signal.

The RF coil unit 14 is disposed, for example, to enclose the region to be imaged of the subject 16. In some examples, the RF coil unit 14 may be referred to as the surface coil or the receive coil. In the static magnetic field space or imaging space 18 where a static magnetic field is formed by the superconducting magnet unit 12, the RF coil unit 15 transmits, based on a control signal from the controller unit 25, an RF pulse that is an electromagnet wave to the subject 16 and thereby generates a high-frequency magnetic field. This excites a spin of protons in the slice to be imaged of the subject 16. The RF coil unit 14 receives, as a magnetic resonance signal, the electromagnetic wave generated when the proton spin thus excited in the slice to be imaged of the subject 16 returns into alignment with the initial magnetization vector. In some embodiments, the RF coil unit 14 may transmit the RF pulse and receive the MR signal. In other embodiments, the RF coil unit 14 may only be used for receiving the MR signals, but not transmitting the RF pulse.

The RF body coil unit 15 is disposed, for example, to enclose the imaging space 18, and produces RF magnetic field pulses orthogonal to the main magnetic field produced by the superconducting field magnet unit 12 within the imaging space 18 to excite the nuclei. In contrast to the RF coil unit 14, which may be disconnected from the MR apparatus 10 and replaced with another RF coil unit, the RF body coil unit 15 is fixedly attached and connected to the MRI apparatus 10. Furthermore, whereas local coils such as those comprising the RF coil unit 14 can transmit to or receive signals from only a localized region of the subject 16, the RF body coil unit 15 generally have a larger coverage area. The RF body coil unit 15 may be used to transmit or receive signals to the whole body of the subject 16, for example. Using receive-only local coils and transmit body coils provides a uniform RF excitation and good image uniformity at the expense of high RF power deposited in the subject. For a transmit-receive local coil, the local coil provides the RF excitation to the region of interest and receives the MR signal, thereby decreasing the RF power deposited in the subject. It should be appreciated that the particular use of the RF coil unit 14 and/or the RF body coil unit 15 depends on the imaging application.

The T/R switch 20 can selectively electrically connect the RF body coil unit 15 to the data acquisition unit 24 when operating in receive mode, and to the RF driver unit 22 when operating in transmit mode. Similarly, the T/R switch 20 can selectively electrically connect the RF coil unit 14 to the data acquisition unit 24 when the RF coil unit 14 operates in receive mode, and to the RF driver unit 22 when operating in transmit mode. When the RF coil unit 14 and the RF body coil unit 15 are both used in a single scan, for example if the RF coil unit 14 is configured to receive MR signals and the RF body coil unit 15 is configured to transmit RF signals, then the T/R switch 20 may direct control signals from the RF driver unit 22 to the RF body coil unit 15 while directing received MR signals from the RF coil unit 14 to the data acquisition unit 24. The coils of the RF body coil unit 15 may be configured to operate in a transmit-only mode, a receive-only mode, or a transmit-receive mode. The coils of the local RF coil unit 14 may be configured to operate in a transmit-receive mode or a receive-only mode.

The RF driver unit 22 includes a gate modulator (not shown), an RF power amplifier (not shown), and an RF oscillator (not shown) that are used to drive the RF coil unit 15 and form a high-frequency magnetic field in the imaging space 18. The RF driver unit 22 modulates, based on a control signal from the controller unit 25 and using the gate modulator, the RF signal received from the RF oscillator into a signal of predetermined timing having a predetermined envelope. The RF signal modulated by the gate modulator is amplified by the RF power amplifier and then output to the RF coil unit 15.

The gradient coil driver unit 23 drives the gradient coil unit 13 based on a control signal from the controller unit 25 and thereby generates a gradient magnetic field in the imaging space 18. The gradient coil driver unit 23 includes three systems of driver circuits (not shown) corresponding to the three gradient coil systems included in the gradient coil unit 13.

The data acquisition unit 24 includes a pre-amplifier (not shown), a phase detector (not shown), and an analog/digital converter (not shown) used to acquire the magnetic resonance signals received by the RF coil unit 14. In the data acquisition unit 24, the phase detector phase detects, using the output from the RF oscillator of the RF driver unit 22 as a reference signal, the magnetic resonance signals received from the RF coil unit 14 and amplified by the pre-amplifier, and outputs the phase-detected analog magnetic resonance signals to the analog/digital converter for conversion into digital signals. The digital signals thus obtained are output to the data processing unit 31.

The MRI apparatus 10 includes a table 26 for placing the subject 16 thereon. The subject 16 may be moved inside and outside the imaging space 18 by moving the table 26 based on control signals from the controller unit 25.

The controller unit 25 includes a computer and a recording medium on which a program to be executed by the computer is recorded. The program when executed by the computer causes various parts of the apparatus to carry out operations corresponding to pre-determined scanning. The recording medium may comprise, for example, a ROM, flexible disk, hard disk, optical disk, magneto-optical disk, CD-ROM, or non-volatile memory. The controller unit 25 is connected to the operating console unit 32 and processes the operation signals input to the operating console unit 32 and furthermore controls the table 26, RF driver unit 22, gradient coil driver unit 23, and data acquisition unit 24 by outputting control signals to them. The controller unit 25 also controls, to obtain a desired image, the data processing unit 31 and the display unit 33 based on operation signals received from the operating console unit 32.

The operating console unit 32 includes user input devices such as a touchscreen, keyboard, and a mouse. The operating console unit 32 is used by an operator, for example, to input such data as an imaging protocol and to set a region where an imaging sequence is to be executed. The data about the imaging protocol and the imaging sequence execution region are output to the controller unit 25.

The data processing unit 31 includes a computer and a recording medium on which a program to be executed by the computer to perform predetermined data processing is recorded. The data processing unit 31 is connected to the controller unit 25 and performs data processing based on control signals received from the controller unit 25. The data processing unit 31 is also connected to the data acquisition unit 24 and generates spectrum data by applying various image processing operations to the magnetic resonance signals output from the data acquisition unit 24.

The display unit 33 includes a display device and displays an image on the display screen of the display device based on control signals received from the controller unit 25. The display unit 33 displays, for example, an image regarding an input item about which the operator inputs operation data from the operating console unit 32. The display unit 33 also displays a slice image or three-dimensional (3D) image of the subject 16 generated by the data processing unit 31.

During a scan, RF coil array interfacing cables may be used to transmit signals between the RF coils (e.g., RF coil unit 14 and RF body coil unit 15) and other aspects of the processing system (e.g., data acquisition unit 24, controller unit 25, and so on), for example to control the RF coils and/or to receive information from the RF coils. As explained previously, the RF body coil unit 15 is a transmit coil that transmits RF signals, and the local surface RF coil 14 receives the MR signals. More generally, RF coils are used to transmit RF excitation signals ("transmit coil"), and to receive the MR signals emitted by an imaging subject ("receive coil"). In an example, the transmit and receive coils are a single mechanical and electrical structure or array of structures, with transmit/receive mode switchable by auxiliary circuitry. In other examples, the transmit body coil (e.g., RF body coil unit 15) and the surface receive coil (e.g., RF coil unit 14) may be independent structures that are physically coupled to each other via a data acquisition unit or other processing unit. For enhanced image quality, however, it may be desirable to provide a receive coil that is mechanically and electrically isolated from the transmit coil. In such case it is desirable that the receive coil, in its receive mode, be electromagnetically coupled to and resonant with an RF "echo" that is stimulated by the transmit coil. However, during transmit mode, it may be desirable that the receive coil is electromagnetically decoupled from and therefore not resonant with the transmit coil, during actual transmission of the RF signal. Such decoupling decreases a likelihood of noise being produced within the auxiliary circuitry when the receive coil couples to the full power of the RF signal. Additional details regarding the uncoupling of the receive RF coil will be described below.

Traditional RF coils may include acid etched copper traces (loops) on printed circuit boards (PCBs) with lumped electronic components (e.g., capacitors, inductors, baluns, resistors, etc.), matching circuitry, decoupling circuitry, and pre-amplifiers. Such a configuration is typically very bulky, heavy, and rigid, and requires relatively strict placement of the coils relative to each other in an array to prevent coupling interactions among coil elements that may degrade image quality. As such, traditional RF coils and RF coil arrays lack flexibility and hence may not conform to patient anatomy, degrading imaging quality and patient comfort.

Thus, according to embodiments disclosed herein, an RF coil array, such as RF coil unit 14, may include distributed capacitance wire conductors rather than copper traces on PCBs with lumped electronic components. As a result, the RF coil array may be lightweight and flexible, allowing placement in low cost, lightweight, waterproof, and/or flame retardant fabrics or materials. The coupling electronics portion coupling the loop portion of the RF coil (e.g., the distributed capacitance wire) may be miniaturized and utilize a low input impedance pre-amplifier, which is optimized for high source impedance (e.g., due to impedance matching circuitry) and allows flexible overlaps among coil elements in an RF coil array. Further, the RF coil array interfacing cable between the RF coil array and system processing components may be flexible and include integrated transparency functionality in the form of distributed baluns, which allows rigid electronic components to be avoided and aids in spreading of the heat load.

FIG. 2 shows a perspective view of an example MRI system 200, similar to the MRI system 10 described above with reference to FIG. 1. MRI system 200 includes several components similar to those included by the MRI system 10. For example, the MRI system 200 includes a field magnet unit 202 (e.g., similar to field magnet unit 12 shown by FIG. 1 and described above) having an opening 204 forming an imaging space 206 (e.g., similar to imaging space 18), and a table 214 (e.g., similar to table 26) for supporting a subject 208 (e.g., a patient, similar to subject 16) to be imaged by the MRI system 200.

In the example shown by FIG. 2, a first RF coil array 210 and a second RF coil array 212 are shown coupled to the patient 208. The first RF coil array 210 and the second RF coil array 212 may each include a plurality of local RF coils, similar to the RF coil unit 14 shown by FIG. 1 and described above. The first RF coil array 210 and the second RF coil array 212 may be coupled to each other via a plurality of fasteners 216. In one example, the fasteners 216 may be hook and loop fasteners. In another example, the fasteners 216 may be different type of fastener (e.g., clamps, buttons, zipper, and the like). In another example, the first RF coil array 210 and the second RF coil array 212 may be implemented within a single or unitary form with the second RF coil array 212 comprising a posterior section that a patient may lie on and the first RF coil array comprising an anterior section that folds over and covers the top of the patient and up to three sides of the unitary form being coupled to each other via fasteners, such as hook and loop fasteners, clamps, buttons, a zipper and the like.

The first RF coil array 210 may be referred to herein as an anterior RF coil array, and the second RF coil array 212 may be referred to herein as a posterior RF coil array. During conditions in which the patient 208 is supported by the table 214 and is in a prone position (e.g., as shown by FIG. 2), the second RF coil array 212 (e.g., posterior RF coil array) is positioned at a posterior end (e.g., back or rear end) of the patient 208, and the first RF coil array 210 is positioned at an anterior end (e.g., front end) of the patient 208. The first RF coil array 210 may include an opening 222 positioned to align with a face of the patient 208 (e.g., toward a first end 218 of the patient 208 at the head of the patient 208, opposite to a second end 220 at the feet of the patient 208) and to encircle the face of the patient during conditions in which the first RF coil array 210 is coupled to the patient. In this configuration, the patient 208 is positioned between the first RF coil array 210 and the second RF coil array 212 on the table 214. RF coils embedded within the first RF coil array 210 and/or second RF coil array 212 may transmit MR signals to a controller unit or processing system of the MRI system (e.g., controller unit 25 described above with reference to FIG. 1) in order to image the patient 208, as described below with reference to the RF coil arrays shown by FIGS. 3-6.

Figure 3:
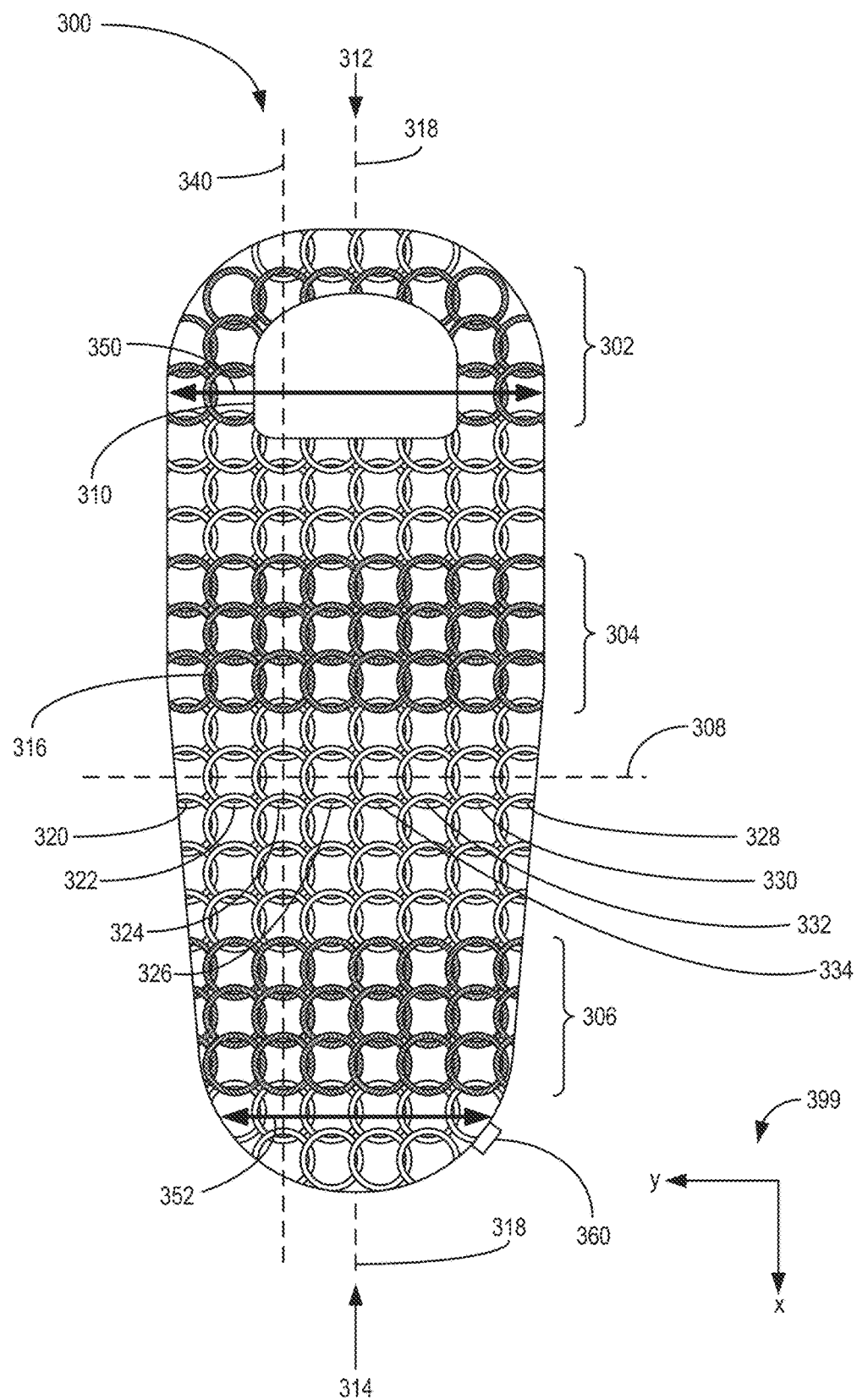
FIG. 3 shows an RF coil array including a plurality of flexible RF coils, according to an embodiment.

FIG. 3 shows an RF coil array 300. The RF coil array 300 may include RF coils similar to the RF coil unit 14 shown by FIG. 1 and may be similar to the first RF coil array 210 shown by FIG. 2 and described above. The RF coil array 300 shown by FIG. 3 includes a first end 312 and a second end 314. During conditions in which the RF coil array 300 is positioned over the body of a patient (such as the patient 16 shown by FIG. 1, or patient 208 shown by FIG. 2), the first end 312 of the RF coil array 300 is positioned at the head of the patient, and the second end 314 of the RF coil array 300 is positioned at the feet of the patient. A central axis 318 of the RF coil array 300 extends from the first end 312 to the second end 314 (e.g., in a direction of the x-axis of reference axes 399), with the first end 312 and second end 314 being similar to the first end 218 and second end 220 shown by FIG. 2, respectively. The RF coil array 300 includes an opening 310 positioned at the first end 312, similar to the opening 222 of the first RF coil array 220 described above. The opening 310 is shaped to encircle a face of the patient. For example, during conditions in which patient is positioned on a table of an MRI system (e.g., the MRI system 10 shown by FIG. 1, MRI system 200 shown by FIG. 2, and the like), the RF coil array 300 is positioned over an anterior side of the patient, and the opening 310 is positioned at the face of the patient.

Figure 5:
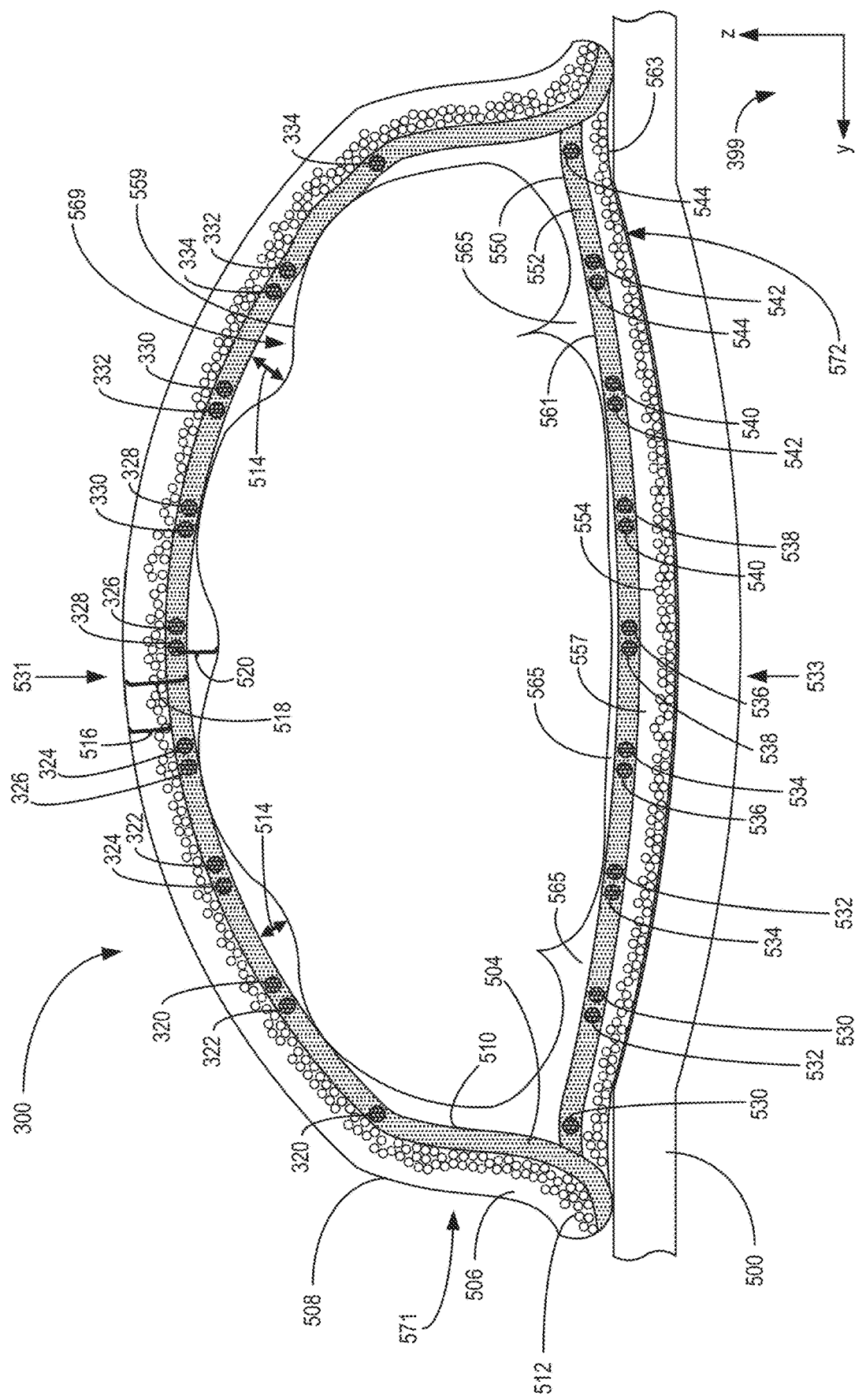
FIG. 5 shows a cross-sectional view of the RF coil array of FIG. 3 and a posterior RF coil array coupled to a body of a patient in an uncompressed state, according to an embodiment.
Figure 6:
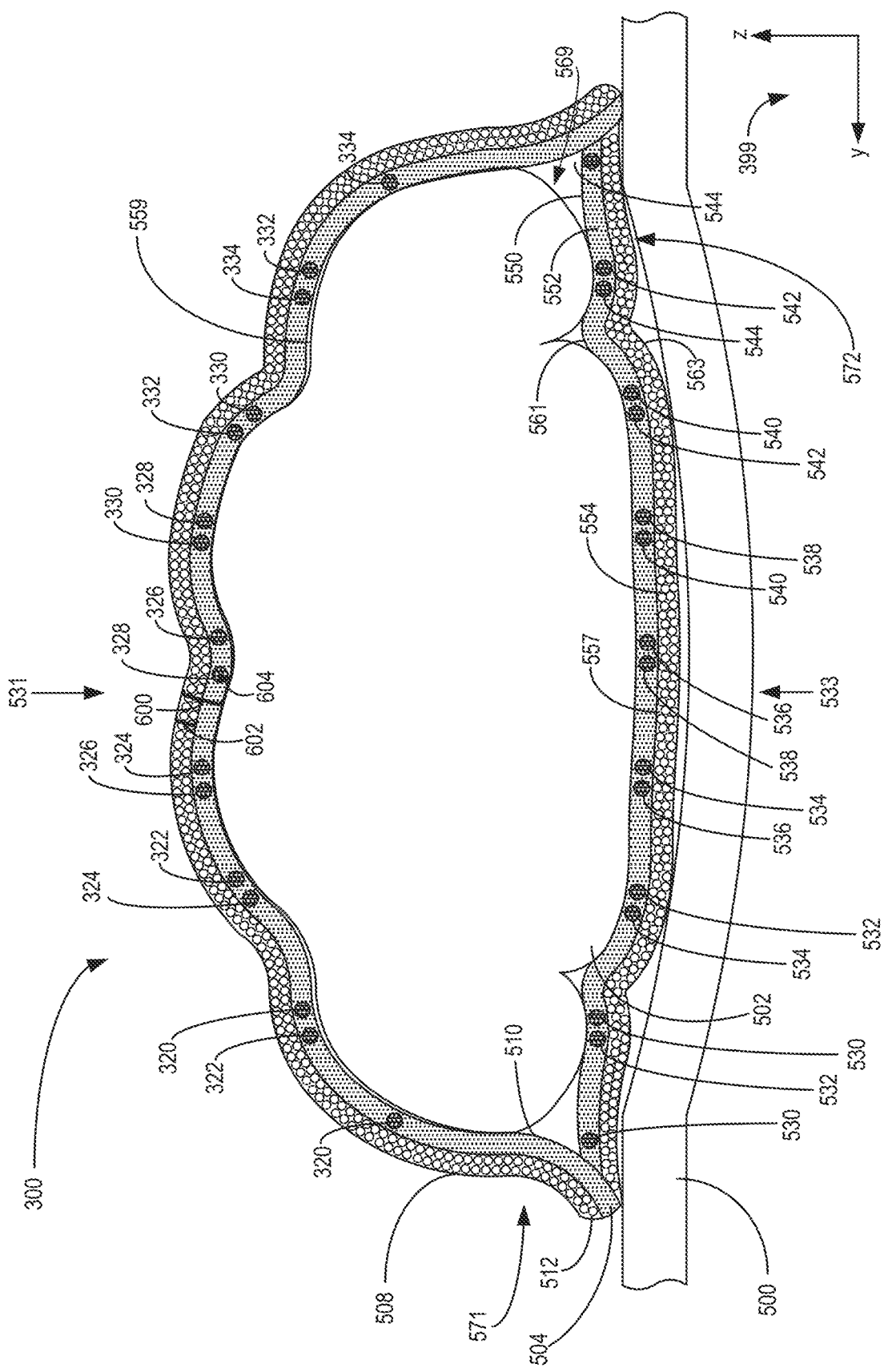
FIG. 6 shows a cross-sectional view of the RF coil array and posterior RF coil array of FIG. 5 coupled to the body of the patient in a compressed state, according to an embodiment.

The RF coil array 300 includes a plurality of RF coils 316 embedded within an interior of the RF coil array 300. The plurality of RF coils 316 may be similar to the RF coil examples described below with reference to FIGS. 8-14. As shown by FIGS. 5-6 and as described further below, the RF coil array 300 may include a plurality of layers, and the plurality of RF coils 316 may be embedded within an inner layer of the RF coil array 300. As described herein, the inner layer refers to a layer of the RF coil array 300 configured to be positioned closer to the body of the patient relative to other layers of the RF coil array 300. Each RF coil of the plurality of RF coils 316 is a flexible RF coil including distributed capacitance wire conductors. In the example shown by FIG. 3, each RF coil of the plurality of RF coils 316 is positioned in alignment with each adjacent RF coil of the plurality of RF coils 316. For example, a first RF coil 320, a second RF coil 322, a third RF coil 324, a fourth RF coil 326, a fifth RF coil 334, a sixth RF coil 332, a seventh RF coil 330, and an eighth RF coil 328 are positioned in alignment along an axis 308, with the axis 308 positioned perpendicular to the central axis 318 (e.g., parallel to the y-axis of the reference axes 399). Additionally, each RF coil may be in alignment with one or more adjacent RF coils in a direction parallel to the central axis 318 (e.g., along axis 340, as one example, positioned parallel to the x-axis of reference axes 399). In some examples, each RF coil may be positioned a same distance from each adjacent RF coil. In other examples, one or more RF coils of the plurality of RF coils 316 may be positioned a different distance relative to one or more adjacent RF coils.

In some examples, one or more of the RF coils of the plurality of RF coils 316 may overlap with one or more adjacent RF coils of the plurality of RF coils 316. For example, FIG. 3 shows the eighth RF coil 328 overlapping the seventh RF coil 330, the seventh RF coil 330 overlapping the sixth RF coil 332, the sixth RF coil 332 overlapping the fifth RF coil 334, the fifth RF coil 334 overlapping the fourth RF coil 326, the fourth RF coil 326 overlapping the third RF coil 324, the third RF coil 324 overlapping the second RF coil 322, and the second RF coil 322 overlapping the first RF coil 320. In other examples, one or more of the RF coils may overlap adjacent RF coils in a different way.

Additionally and/or alternately, one or more of the RF coils may overlap with one or more adjacent RF coils (e.g., the first RF coil 320 may overlap with the second RF coil 322 such that a loop section of the first RF coil 320 overlaps a portion of a loop section of the second RF coil 322 and couples the first RF coil 320 to the second RF coil 322).

Each RF coil of the plurality of RF coils 316 may be electrically coupled to a controller unit or processing system of the MRI system (e.g., controller unit 25 described above with reference to FIG. 1). For example, each RF coil may be configured to transmit MR signals to the processing system, and the processing system may process the signals in order to produce an image of the patient. During conditions in which the RF coil array 300 is positioned over the patient and the plurality of RF coils 316 are electrically coupled to the processing system in order to transmit MR signals to the processing system, an operator of the MRI system (e.g., a technician) may select one or more sections of the RF coil array 300 to transmit MR signals to the processing system from only the one or more sections. For example, FIG. 3 shows a first section 302, a second section 304, and a third section 306. The first section 302 may be referred to herein as a first RF coil group, the second section 304 may be referred to herein as a second RF coil group, and the third section 306 may be referred to herein as a third RF coil group.

In one example, the operator may interact with the user input device of the MRI system (e.g., a keyboard, touch-screen, etc.) in order to select one of the sections of the RF coil array 300 (e.g., first section 302, second section 304, and/or third section 306) and transmit MR signals to the processing system from only the selected sections. The operator may select one or more of the sections by inputting the selection into a control program stored in non-transitory memory of the processing system of the MRI system, for example, via the user input device (e.g., user interface device). In some examples, the selection may include only a single RF coil of the RF coil array 300. In other examples, the selection may include two or more of the RF coils of the RF coil array 300. In another example, the operator may selectably couple the one or more sections to the processing system in order to transmit MR signals to the processing system from only the one or more sections. For example, the RF coils included within the first section 302 may be electrically coupled to a first wire harness, and the first wire harness may be electrically coupled to the processing system by the operator (e.g., plugged into the processing system) in order to transmit MR signals to the processing system from only the first section 302 and not from the other sections (e.g., second section 304 and third section 306).

By transmitting MR signals to the processing system from only one or more sections of the RF coil array 300 (and not all of the sections of the RF coil array), a scan or imaging time of the patient may be reduced. For example, by transmitting MR signals to the processing system from only the first section 302 and not from the second section 304 and the third section 306, the processing system may process the MR signals to produce the image of the patient in a reduced amount of time. Additionally, during conditions in which the processing system is configured to store the image of the patient in non-transitory memory, transmitting signals to the processing system from only the first section 302 and not from the second section 304 and the third section 306 may reduce a stored size of the image in the non-transitory memory.

Because each RF coil of the plurality of RF coils 316 of the RF coil array 300 is a flexible RF coil including distributed capacitance wire conductors as described above, each RF coil may shift (e.g., move) relative to each adjacent RF coil without degradation of the MR signals transmitted by the RF coils to the processing system of the MRI system. For example, as described above, one or more of the RF coils of the plurality of RF coils 316 may overlap with one or more adjacent RF coils of the plurality of RF coils 316. Each RF coil is configured to reduce an amount of electrical interaction with adjacent RF coils. For example, due to the distributed capacitance wire conductors, MR signals transmitted to the processing system by the first RF coil 320 may not be adjusted or otherwise altered by MR signals transmitted to the processing system by the second RF coil 322. In some examples, the first RF coil 320 and second RF coil 322 may overlap each other by different amounts (e.g., the first RF coil 320 and second RF coil 322 may be movable relative to each other and may overlap each other by a variable amount), and the MR signals transmitted to the processing system by the first RF coil 320 may not be altered by the position of the second RF coil 322 relative to the first RF coil 320 (e.g., may not be altered by the amount of overlap of the second RF coil 322 with the first RF coil 320).

Although the first RF coil 320 and second RF coil 322 are described above with reference to the overlap of the RF coils, other RF coils of the plurality of RF coils 316 may overlap with adjacent RF coils in a similar way (e.g., eighth RF coil 328 may overlap with seventh RF coil 330, and MR signals transmitted to the processing system by the seventh RF coil 330 and eighth RF coil 328 are not altered by the position of the seventh RF coil and eighth RF coil relative to each other).

Figure 4:
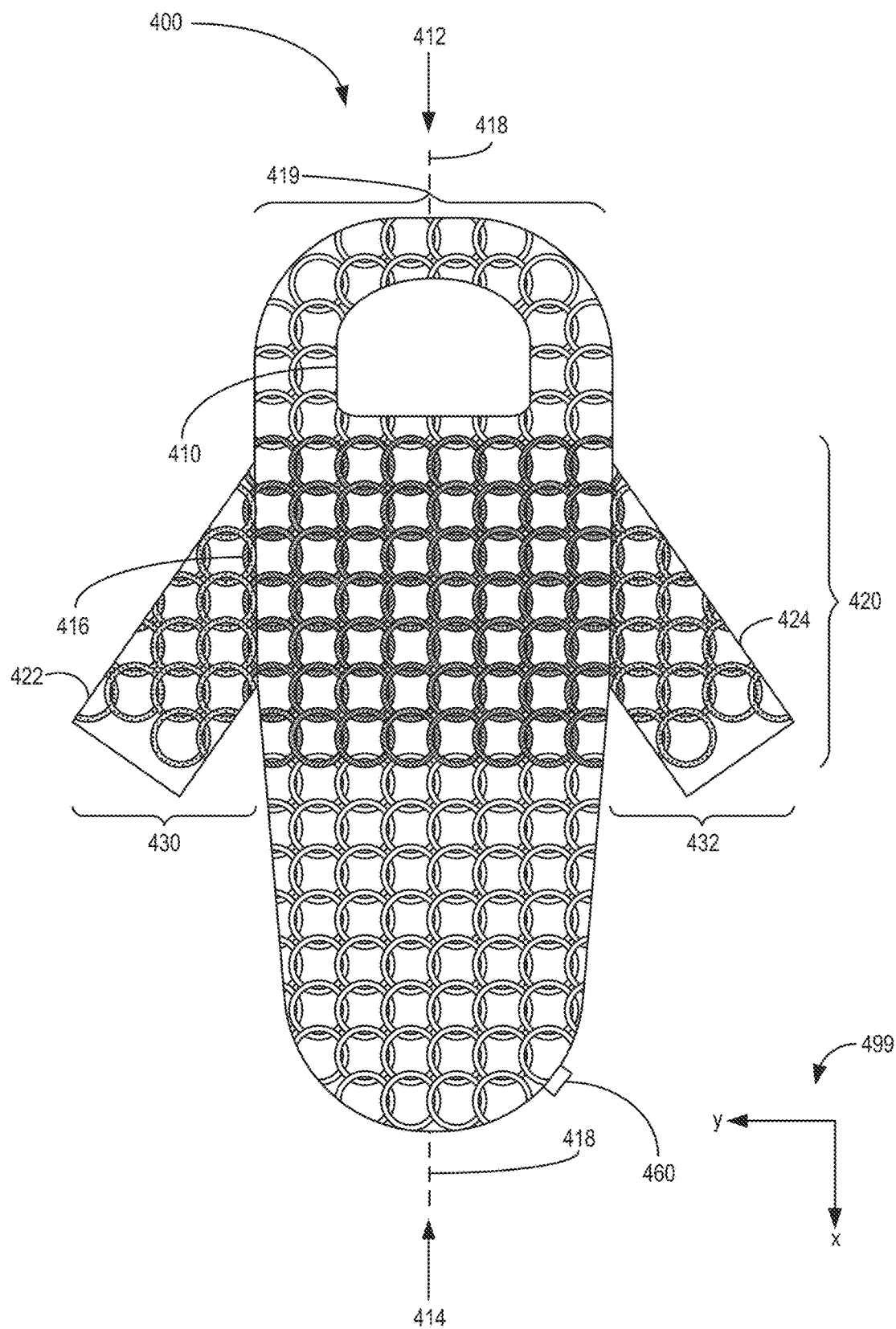
FIG. 4 shows an RF coil array including a plurality of flexible RF coils and extensions shaped to surround limbs or extremities of a patient, according to an embodiment.

FIG. 4 shows a second example of an RF coil array 400, similar to the RF coil array 300 shown by FIG. 3. The RF coil array 400 includes a plurality of RF coils 416, with each RF coil of the plurality of RF coils 416 being a flexible RF coil having distributed capacitance wire conductors (e.g., similar to the plurality of RF coils 316 shown by FIG. 3 and described above, and similar to the examples described below with reference to FIGS. 8-14). The plurality of RF coils 416 may be in a similar arrangement to the plurality of RF coils 316 shown by FIG. 3 and described above. For example, one or more RF coils of the plurality of RF coils 416 may be aligned with adjacent RF coils of the plurality of RF coils 416 (e.g., in a direction parallel to central axis 418, and/or in a direction perpendicular to the central axis 418). The central axis 418 (e.g., similar to central axis 318 of RF coil array 300 shown by FIG. 3 and described above) extends from a first end 412 of the RF coil array 400 to a second end 414 of the RF coil array 400, with the first end 412 and the second end 414 being similar to the first end 312 and the second end 314, respectively, described above with reference to the RF coil array 300 shown by FIG. 3. Specifically, the first end 412 is positioned at a head of a patient during conditions in which the RF coil array 400 is positioned over the patient, and the second end 414 is positioned at the feet of the patient. The RF coil array 400 includes an opening 410 shaped to encircle face of the patient, similar to the opening 310 described above with reference to the RF coil array 300.

The RF coil array 400 includes a first extension 422 and a second extension 424 each extending outward (e.g., away from the central axis 418), with each of the first extension 422 and the second extension 424 being adapted to enclose a limb or extremity of the patient (e.g., appendages of the patient, such as arms of the patient). For example, the first extension 422 may be shaped to enclose a right arm of the patient, and the second extension 424 may be shaped to enclose a left arm of the patient. In one example, enclosing the arms of the patient via the first extension 422 and/or the second extension 424 may include positioning the first extension 422 and/or the second extension 424 over the arms of the patient during conditions in which the patient is positioned on a table of the MRI system (e.g., table 26 shown by FIG. 1 and described above, table 214 shown by FIG. 2, and the like).

The plurality of RF coils 416 extends into each of the first extension 422 and the second extension 424. The RF coils extending into the first extension 422 may be referred to herein as a first section 430 of the plurality of RF coils 416, and RF coils extending into the second extension 424 may be referred to herein as a second section 432 of the plurality of RF coils 416. In some examples, the first section 430 and/or the second section 432 may be selectably coupled (e.g., electrically coupled) to a processing system of the MRI system, similar to the examples of the first section 302, the second section 304, and the third section 306 of the RF coil array 300 shown by FIG. 3 and described above. Specifically, the first section 430 may be electrically coupled to the processing system of the MRI system so that MR signals are transmitted only from the first section 430 to the processing system, and MR signals are not transmitted to the processing system from other sections of the RF coil array 400. Similarly, the second section 432 may be electrically coupled to the processing system of the MRI system so that MR signals are transmitted only from the second section 432 to the processing system, and MR signals are not transmitted to the processing system from other sections of the RF coil array 400. In other examples, both of the first section 430 and the second section 432 may be electrically coupled to the processing system so that MR signals are transmitted from both of the first section 430 and the second section 432 to the processing system, and MR signals are not transmitted to the processing system from other sections of the RF coil array 400.

In yet other examples, the first section 430 and the second section 432 may each be included by one or more other sections of the RF coil array 400, such as main anterior section 420. The main anterior section 420 includes RF coils positioned between the first extension 422 and the second extension 424 (e.g., in a direction of the y-axis of reference axes 499 and perpendicular to the central axis 418 of the RF coil array 400), and the main anterior section 420 may be electrically coupled to the processing system so that MR signals are transmitted to the processing system from the RF coils of the main anterior section 420 (e.g., the RF coils of the first section 430, the second section 432, and RF coils positioned between the first section 430 and the second section 432 as described above). In some examples, MR signals may be transmitted to the processing system from only the RF coils included by the main anterior section 420. In other examples, MR signals may be transmitted to the processing system from all of the RF coils of the RF coil array 400. Although the main anterior section 420, the first section 430, and the second section 432 are described above as examples of sections of the RF coil array 400 that may be selectively coupled to the processing system of the MRI system, in other examples the RF coil array 400 may include sections having a different relative arrangement and/or a different number of RF coils, with each section being selectably coupleable to the processing system as described above.

In some examples, the operator of the MRI system may interact with the user input device of the MRI system (e.g., a keyboard, touchscreen, etc.) in order to select one or more of the sections of the RF coil array 400 (e.g., main anterior section 420, first section 430, and/or second section 432) and transmit MR signals to the processing system from only the one or more selected sections. In some examples, a selected section may include only a single RF coil of the RF coil array 400. In other examples, one or more selected sections may include two or more of the RF coils of the RF coil array 400.

In one example, the operator may select one or more of the sections by inputting the selection (e.g., the selected sections) into an executable control program stored in non-transitory memory of the processing system of the MRI system, for example, via the user input device (e.g., user interface device) of the MRI system. The control program may adjust an operational mode of the processing system (e.g., open and/or close one or more data input channels of the processing system) in order to enable MR signals to be transmitted to the processing system from only the selected sections of the RF coil array.

The RF coil array 400 may include an outer chamber similar to the example described below with reference to FIGS. 5-6, and the outer chamber may extend into one or more of the first extension 422 and second extension 424. In one example, the outer chamber of the RF coil array 400 extends through an entirety of the RF coil array 400 (e.g., through both of the first extension 422, the second extension 424, and each other portion of the RF coil array 400, such as central section 419). In another example, the outer chamber may extend into only one of the first extension 422 or second extension 424 from the central section 419. In yet other examples, the outer chamber may extend only through the central section 419 and not into either of the first extension 422 or second extension 424. Other configurations are possible. As referred to herein, the outer chamber is a chamber formed within an interior of the RF coil array 400. The outer chamber is configured to be positioned further from the body of the patient than the RF coils of the RF coil array 400 during conditions in which the RF coil array 400 is coupled to the patient (e.g., positioned against the body of the patient for imaging of the patient).

As described above, the RF coil array 400 is configured to be positioned over the patient (e.g., over an anterior end of the patient). In some examples, the RF coil array 400 may be coupled to a second RF coil array configured to be positioned at a posterior end of the patient (e.g., similar to the second RF coil array 212 shown by FIG. 2 and described above). Specifically, the patient may be positioned between the RF coil array 400 and the posterior RF coil array on the table of the MRI system, with the posterior RF coil array positioned against the table. In this configuration, the posterior RF coil array may transmit MR signals to the processing system of the MRI system in order to image the posterior end of the patient, and the RF coil array 400 may transmit MR signals to the processing system of the MRI system to image the anterior end of the patient. An example posterior RF coil array shown by FIG. 5 and described further below.

In another example, as described above with reference to the first RF coil array 210 and the second RF coil array 212 shown by FIG. 2, the RF coil array 400 and the posterior RF coil array may be implemented within a single or unitary form. For example, the posterior RF coil array may comprise a posterior section of the unitary form that a patient may lay on, and the RF coil array 400 may comprise an anterior section of the unitary form that folds over and covers the top of the patient. Up to three sides of the unitary form may be coupled to each other via fasteners, such as hook and loop fasteners, clamps, buttons, a zipper and the like.

FIG. 5 shows a cross-sectional view of the RF coil array 300 shown by FIG. 3 and described above. In the example shown by FIG. 5, the RF coil array 300 is positioned over the anterior end 531 of a body 559 of a patient 569, and the patient 569 is positioned on a table 500 of an MRI system (e.g., similar to the table 31 and MRI system 10 shown by FIG. 1 and described above). FIG. 5 additionally shows a posterior RF coil array 550, similar to the second RF coil array 212 described above with reference to FIG. 2. As described above with reference to the first RF coil array 210 and the second RF coil array 212 shown by FIG. 2, the RF coil array 300 and the posterior RF coil array 550 may be implemented within a single or unitary form, in some examples. For example, the posterior RF coil array 550 may comprise a posterior section of the unitary form that a patient may lay on, and the RF coil array 300 may comprise an anterior section of the unitary form that folds over and covers the top of the patient. Up to three sides of the unitary form may be coupled to each other via fasteners, such as hook and loop fasteners, clamps, buttons, a zipper and the like.

In the example shown by FIG. 5, both of the RF coil array 300 and the posterior RF coil array 550 are in a decompressed state. Specifically, the RF coil array 300 may include an outer chamber 506 and the posterior RF coil array 550 includes an outer chamber 557, and in the example shown by FIG. 5, the outer chamber 506 and the outer chamber 557 are maintained at approximately atmospheric pressure. In other words, gases (e.g., air) contained within the outer chamber 506 and the outer chamber 557 may have a pressure approximately equal to a pressure of air surrounding an exterior of the RF coil array 300 and the posterior RF coil array 550.

The outer chamber 506 is a chamber formed within an interior of the RF coil array 300, and the outer chamber 557 is a chamber formed within an interior of the posterior RF coil array 550. As referred to herein, the outer chamber 506 and outer chamber 557 are each configured to be positioned further from the body of the patient than RF coils of their respective RF coil arrays (e.g., RF coil array 300 and posterior RF coil array 550, respectively) during conditions in which the RF coil arrays are coupled to the patient for imaging of the patient (e.g., via the MRI system). In some examples, the outer chamber 506 and outer chamber 557 are fluidly isolated from each other (e.g., separated such that gases within the outer chamber 506 do not mix and/or converge with gases from the outer chamber 557). In other examples, the outer chamber 506 and outer chamber 557 may be fluidly coupled to each other (e.g., via one or more tubes or gas passages, in one example, and/or in examples in which the RF coil array 300 and posterior RF coil array 550 are implemented within a single or unitary for, as described above). In one example, the outer chamber of each of the RF coil array 300 and the posterior RF coil array 550 may be fluidly coupled to atmosphere by one or more ports, and air surrounding an exterior of the RF coil array 300 and posterior RF coil array 550 may flow into and/or out of each RF coil array (e.g., into and/or out of the outer chamber 506 and/or outer chamber 557) via the respective ports. For example, air may flow into and/or out of the outer chamber 506 via the port 360 of the RF coil array 300 shown by FIG. 3 and described above. The posterior RF coil array 550 may include a port similar to the port 360, and air may flow into or out of the outer chamber 557 via the port of the posterior RF coil array 550.

In the examples described herein, the ports of the posterior RF coil array 550 and/or RF coil array 300 may each include one or more integrated valves, and an amount of opening of the one or more valves may be adjusted (e.g., opened or closed by an MRI technician, in one example) in order to control an amount of gases flowing into and/or out of the corresponding outer chambers of the RF coil arrays. For example, port 360 may include an integrated two-way valve (e.g., integrated with an opening of the port 360) that may be adjusted to a fully opened position, a fully closed position, and a plurality of positions between the fully opened position and the fully closed position. In the fully opened position, the outer chamber 506 of the RF coil array 300 may be fluidly coupled to a gas source (e.g., to atmosphere), and in the fully closed position, the outer chamber 506 of the RF coil array 300 is sealed to the gas source (e.g., such that gases do not flow into or out of the outer chamber 506 via the port 360). The valve may be transitioned from the fully closed position to the fully opened position (and vice versa) through the plurality of positions between the fully closed position and the fully opened position.

In other examples, the RF coil array 300 may include a plurality of ports similar to the port 360. Each port of the plurality of ports may include one or more valves similar to the two-way valve described above, or may include valves having a different configuration. For example, a first port of the RF coil array 300 may include a first one-way valve (e.g., check valve) enabling gases to flow into the outer chamber 506 but not out of the outer chamber 506 during conditions in which the first one-way valve is in an opened position, and to seal the outer chamber 506 (e.g., seal the first port and prevent gases from flowing out of the outer chamber 506) during conditions in which the first one-way valve is in a fully closed position. Similarly, a second port of the RF coil array may include a second one-way valve (e.g., check valve) configured to enable gases to flow out of the outer chamber 506 but not into the outer chamber 506 during conditions in which the second one-way valve is in an opened position, and to seal the outer chamber 506 (e.g., seal the second port) during conditions in which the second one-way valve is in a fully closed position.

In some examples, one or more of the valves described above may be electrically actuated valves, with the amount of opening of the one or more valves being adjustable via electrical signals transmitted to the one or more valves via the processing system of the MRI system. For example, the processing system may transmit an electrical signal having a first pulse width to one of the valves in order to adjust the valve from a fully closed position to a fully opened position, and may transmit an electrical signal having a second pulse width to the valve to adjust the valve from the fully opened position to the fully closed position. In other examples, the one or more valves may not be electrically actuated and may instead be actuated in a different way (e.g., physically actuated via a lever, switch, and the like, or automatically actuated via a pressure differential between the outer chamber 506 and the gas source and without interaction by the operator, as some examples).

In some examples, port 360 may be formed together with its one or more corresponding valves as a single piece (e.g., integrated together with the one or more valves as a single unit). Although the port 360 is described above to include one or more valves as an example, the port of the posterior RF coil array 550 may include a similar configuration (e.g., similar integrated valve configuration).

Reference axes 399 are shown by FIG. 5 for comparison of the view shown by FIG. 5 with the view shown by FIG.

3. The view shown by FIG. 5 is a cross-sectional view along the axis 308 shown by FIG. 3. Specifically, FIG. 5 shows a view of a torso of the body 559 of the patient 569 on the cross-sectional plane formed by the y-axis and z-axis of reference axes 399.

As described above with reference to FIG. 3, the RF coil array 300 includes the plurality of RF coils 316 (e.g., as shown by FIG. 3) embedded therein, and the plurality of RF coils 316 includes the first RF coil 320, second RF coil 322, third RF coil 324, fourth RF coil 326, fifth RF coil 328, sixth RF coil 330, seventh RF coil 332, and eighth RF coil 334. As shown by FIG. 5, the RF coil array 300 includes a flexible shell 571 having a first exterior surface 508 and a second exterior surface 510. The second exterior surface 510 is positioned at an inner layer 504 of the flexible shell 571, and the plurality of RF coils 316 (and RF coils included therein, including the first RF coil 320, second RF coil 322, etc.) are embedded within the inner layer 504. Although the plurality of RF coils 316 are described herein has been embedded within the inner layer 504, in other examples the plurality of RF coils 316 may instead be coupled directly to the inner layer 504 (e.g., sewn to the inner layer 504, fused with the inner layer 504, etc.). The inner layer 504 is a layer of the RF coil array 300 configured to be positioned closer to the body of the patient than the outer chamber 506 during conditions in which the RF coil array 300 is coupled to the body of the patient (e.g., positioned over the patient) for imaging of the body of the patient (e.g., via the MRI system).

The inner layer 504 has a thickness approximately equal to a thickness of each RF coil of the plurality of RF coils 316. In some examples, such as the example shown by FIG. 5, the inner layer 504 may have a thickness slightly greater than a thickness of the RF coils of the RF coil array 300 (e.g., a thickness of the first RF coil 320, the second RF coils 322, etc.). In one example, the thickness of the inner layer 504 may be 5 millimeters or less, and the thickness of each RF coil of the RF coil array 300 may be 3 millimeters or less. In the example shown by FIG. 5, the plurality of RF coils 316 are embedded within the inner layer such that the inner layer surrounds an entirety of each RF coil of the plurality of RF coils 316. The inner layer 504 may be comprised of one or more sheets of a flexible material (e.g. a coated textile fabric, a flame-resistant meta-aramid material, etc.) that is transparent to MR and RF signals emitted by and/or received by the plurality of RF coils 316 (e.g., transparent to electromagnetic radio frequency signals emitted by the body of patient 559 and received by the plurality of RF coils 316, similar to the examples described above with reference to the RF coils shown by FIG. 1 and FIG. 2). In some examples, the inner layer may include first and second sheets of a fabric material (e.g., meta-aramid, a blend of meta-aramid and para-aramid, polybenzimidazole, modacrylic, etc.) and the plurality of RF coils 316 may be embedded within the inner layer 504 between the first and second sheets of fabric material (e.g., sewn to the first and/or second sheet of fabric material). In other configurations, the inner layer 504 may include a third sheet of fabric material forming the second exterior surface 510 of the RF coil array 300, with the plurality of RF coils 316 being positioned between the first and second sheets of fabric material, and with the first and second sheets being positioned between the third sheet and a loose fill 512 of the RF coil array 300 (shown by FIG. 5 and described below).

As described above, each RF coil of the plurality of RF coils 316 is a flexible RF coil that is able to deform (e.g., bend) in multiple, different directions. As the RF coil array 300 is positioned on the body of the patient (e.g., at the anterior end 531 of the patient), the inner layer 504 of the RF coil array 300 may deform (e.g., bend, flex, fold, etc.) to approximately conform to the patient's body. As the inner layer 504 deforms, the RF coils embedded within the inner layer 504 (e.g., the plurality of RF coils 316) may also deform in a similar way, thereby enabling the plurality of RF coils 316 to be positioned closer to the body of the patient.

The inner layer 504 is a layer of the RF coil array 300 that is positioned closer to the body of the patient relative to the outer chamber 506 during conditions in which the RF coil array 300 is coupled to the patient (e.g., positioned over the anterior end of the patient while the patient is in a prone position on the table 500 of the MRI system). Specifically, the flexible shell 571 of the RF coil array 300 includes the first exterior surface 508 and the second exterior surface 510, with the first exterior surface 508 being positioned opposite to the second exterior surface 510 across a width of the RF coil array 300. The second exterior surface 510 is a surface positioned in direct contact with the body of the patient (e.g., the anterior end 531 of the patient), and the first exterior surface 508 is not positioned in contact with the body of the patient. The inner layer 504 is formed partially by the second exterior surface 510 and is not formed by the first exterior surface 508. The first exterior surface 508 is separated from the second exterior surface 510 by the outer chamber 506. In some examples, the outer chamber 506 is sealed by the first exterior surface 508 and the second exterior surface 510 such that fluids (e.g., gases, such as air) may only flow in and/or out of the outer chamber 506 via the port 360 (e.g., via one or more valves integrated with the port 360, as described above).

The outer chamber 506 includes the loose fill 512 disposed therein. In one example, the loose fill 512 comprises a plurality of particles (e.g., pellets, beads, etc.), with each particle being free to move relative to each other particle of the loose fill 512. In one example, the plurality of particles of the loose fill 512 may be formed of a plastic material (e.g., expanded polystyrene). In other examples, the plurality particles of the loose fill 512 may be formed of a different material or a mix of different materials (e.g., expanded polyethylene foam, a mixture of expanded polyethylene foam and expanded polystyrene, etc.). In other words, each particle included by the loose fill 512 may move, shift, etc., within the outer chamber 506 freely relative to the inner layer 504, first exterior surface 508, and each other particle of the loose fill 512. Accordingly, the positions of the particles of the loose fill 512 shown by FIG. 5 are included as one example arrangement of the particles of the loose fill 512. However, during conditions in which the RF coil array 300 is in an uncompressed state as shown by FIG. 5, the particles of the loose fill 512 are free to move into a plurality of positions different than those shown by FIG. 5. The loose fill 512 is contained within the outer chamber 506 and does not flow into or out of the outer chamber 506. During conditions in which the port 360 is opened (e.g., a valve integrated with the port 360 is moved into an opened position, as described above), the loose fill 512 may be prevented from flowing out of the outer chamber 506 via the port 360 by one or more retaining features (e.g., filters, grates, etc.). The retaining features may be sized to prevent the loose fill 512 from flowing out of the port 360 and to enable gases to flow into and/or out of the port 360.

The posterior RF coil array 550 may include a configuration similar to that described above with reference to the RF coil array 300. For example, the posterior RF coil array 550 shown by FIG. 5 includes a flexible shell 572 having an inner layer 552 with a plurality of RF coils embedded therein (e.g., RF coil 530, RF coil 532, RF coil 534, RF coil 536, RF coil 538, RF coil 540, RF coil 542, and RF coil 544, similar to the first through eighth RF coils of the RF coil array 300 described above). Similar to the example of the inner layer 504 described above, the inner layer 552 is a layer of the posterior RF coil array 550 configured to be positioned closer to the body of the patient than the outer chamber 557 during conditions in which the posterior RF coil array 550 is coupled to the body of the patient (e.g., positioned underneath the patient, between the body of the patient and the MRI table 500) for imaging of the body of the patient (e.g., via the MRI system). Additionally, the shell 572 of the posterior RF coil array 550 includes a first exterior surface 561 positioned opposite to a second exterior surface 563, with outer chamber 557 being positioned between the inner layer 552 and the second exterior surface 563 (e.g., similar to the outer chamber 506 being positioned between inner layer 504 and first exterior surface 508 of the RF coil array 300). The outer chamber 557 includes a second loose fill 554 disposed therein, with the second loose fill 554 being similar to the first loose fill 512. The second loose fill 554 includes a plurality of particles (e.g., pellets), with the particles of the second loose fill 554 being free to move within the outer chamber 557 of the posterior RF coil array 550 relative to each other and relative to the inner layer 552 and second exterior surface 563. Similar to the example of the loose fill 512 of the RF coil array 300 described above, the second loose fill 554 of the posterior RF coil array 550 may be unable to flow out of the outer chamber 557 of the posterior RF coil array 550 (e.g., unable to flow out of one or more ports of the posterior RF coil array 550 via one or more valves integrated with the one or more ports, as described above) and may be retained within the outer chamber 557 by one or more retaining features similar to those described above with reference to the RF coil array 300.

In some examples, the posterior RF coil array 550 may be coupled to the RF coil array 300 by one or more fasteners (e.g., opposing hook and loop fasteners, buttons, adhesive strips, etc.). In other examples, the posterior RF coil array 550 and the RF coil array 300 may overlap with each other in order to retain a position of the posterior RF coil array 550 and RF coil array 300 relative to each other. For example, the posterior RF coil array 550 may include one or more slots shaped to receive one or more counterpart extensions of the RF coil array 300, with the extensions of the RF coil array 300 and engaging with slots of the posterior RF coil array 550 to maintain the position of the RF coil array 300 relative to the posterior RF coil array 550 (e.g., to maintain the RF coil array 300 at the anterior end 531 of the body 559 of the patient 569, and to maintain the posterior RF coil array 550 at the posterior end 533 of the body 559 of the patient 569). In some examples, the posterior RF coil array 550 may be coupled directly to the table or embedded into the table. One or more connectors or cables electrically coupling the posterior RF coil array 550 to the MRI system may be integrated into an interior of the table and/or directly coupled to the table.

During conditions in which the posterior RF coil array 550 is positioned at the posterior end 533 of the body 559 of the patient 569, the inner layer 552 of the posterior RF coil array 550 is positioned closer to the body 559 of the patient 569 than the second exterior surface 563 of the posterior RF coil array 550. Specifically, the first exterior surface 561 of the posterior RF coil array 550 (e.g., of shell 572) is positioned in direct contact with the body 559 of the patient 569 at the posterior end 533 of the body 559 of the patient 569. As described herein, contact of the first exterior surface 561 of the posterior RF coil array 550 with the body 559 of the patient 569 refers to the body 559 of the patient 569 (e.g., the skin of the patient) being in direct, nearly-continuous contact with the first exterior surface 561 of the posterior RF coil array 550. The first exterior surface 561 may define a first face and the body 559 of the patient 569 (e.g., the skin) may define a second face, and the first and second faces are in contact with each other (e.g., positioned against each other). The second exterior surface 563 of the posterior RF coil array 550 is not positioned in contact with the body 559 of the patient 569. Instead, the second exterior surface 563 is positioned in contact with the table 500 of the MRI system. In this configuration, the RF coils of the posterior RF coil array 550 are positioned closer to the posterior end 533 of the body 559 of the patient 569.

Similar to the example of the inner layer 504 and the plurality of RF coils 316 of the RF coil array 300, the inner layer 552 and RF coils of the posterior RF coil array 550 are able to deform (e.g., bend, fold, etc.). For example, the inner layer 552 of the posterior RF coil array 550 may be formed of a flexible material (e.g., a coated textile fabric, a flame-resistant meta-aramid material, a blend of meta-aramid and para-aramid fabrics, polybenzimidazole, modacrylic, etc.), with the RF coils of the posterior RF coil array 550 being flexible RF coils similar to those described above with reference to the RF coil array 300. In one example, the inner layer 552 may be formed of a same material as the inner layer 504 of the RF coil array 300.

In the configuration described above and shown by FIG. 5, the second exterior surface 510 of the RF coil array 300 closely conforms to the body 559 of the patient 569. However, as the RF coil array 300 is positioned over the anterior end 531 of the body 559 of the patient 569, one or more gaps 514 (e.g., voids, air pockets, etc.) may be positioned between the second exterior surface 510 and the body 559 of the patient 569. Due to the gaps 514, the RF coils embedded within the inner layer 504 may be offset from the body 559 of the patient 569 by a greater distance than if the gaps 514 were not positioned between the body 559 of the patient 569 and the second exterior surface 510. Additionally, a thickness 518 of the shell 571 of the RF coil array 300 (e.g., a length from the first exterior surface 508 to the second exterior surface 510) may be increased by a thickness 516 of the outer chamber 506 during conditions in which the RF coil array 300 is in the uncompressed state (e.g., as shown by FIG. 5). The increased thickness 518 of the RF coil array 300 may result in one or more of the RF coils of the RF coil array 300 (e.g., fourth RF coil 326, fifth RF coil 328, etc.) being positioned in an increased distance 520 from the body 559 of the patient 569. Similarly, one or more gaps 565 may be positioned between the posterior RF coil array 550 and the body 559 of the patient 569 at the posterior end 533 of the body 559 of the patient 569. The gaps 565 may increase a distance between the body of the patient and one or more of the RF coils of the posterior RF coil array 550. In order to reduce a size of the gaps (e.g., gaps 514, gaps 565, etc.), the RF coil array 300 and/or the posterior RF coil array 550 may be adjusted from the uncompressed state to one of a plurality of compressed states, described below with reference to FIG. 6.

As described herein, an uncompressed state may refer to conditions in which a pressure of gases within the outer chamber of the RF coil arrays (e.g., outer chamber 506 of RF coil array 300, outer chamber 557 of posterior RF coil array 550, and the like) is within a threshold range, and the compressed state may refer to conditions in which the pressure of gases within the outer chamber of the RF coil arrays is outside of the threshold range (e.g., higher or lower than the threshold range). For example, the threshold range may be +/−0.17 atm relative to a pressure of atmospheric air surrounding the exterior of the RF coil array (e.g., external to the outer chamber), and the uncompressed state may be one of a plurality of uncompressed states, with each uncompressed state corresponding to a different pressure within the continuous range of pressures of +/−0.17 atm relative to atmospheric pressure. A compressed state may refer to conditions in which the pressure of gases within the outer chamber of the RF coil array is less than or greater than the threshold range. For example, a compressed state may be one of compressed states corresponding to gas pressures within the outer chamber exceeding 0.17 atm above atmospheric pressure or gas pressures within the outer chamber being less than atmospheric pressure by an amount greater than 0.17 atm. Transitioning the RF coil array from an uncompressed state to a compressed state may include adjusting the pressure of gases within the outer chamber from a value in a range between 0.17 atm below atmospheric pressure (e.g., 0.83 atm) and 0.17 bar above atmospheric pressure (e.g., 1.17 atm), to a value of 0.17 atm or more below atmospheric pressure (e.g., 0.80 atm) or a value of 0.17 atm or more above atmospheric pressure (e.g., 1.20 atm), only by flowing gases into or out of the outer chamber (e.g., to/from atmosphere). Similarly, transitioning the RF coil array from a compressed state to an uncompressed state may include adjusting the pressure of gases within the outer chamber from a value of 0.17 atm or more below atmospheric pressure (e.g., 0.78 atm) or a value of 0.17 atm or more above atmospheric pressure (e.g., 1.23 atm), to a value in a range between 0.17 atm less than atmospheric pressure (e.g., 0.95 atm) and 0.17 atm greater than atmospheric pressure (e.g., 1.05 atm), only by flowing gases into or out of the outer chamber (e.g., increasing or decreasing a total mass of gases stored within the outer chamber, via a pump for example).

FIG. 6 shows a view similar to the view shown by FIG. 5, with the RF coil array 300 and the posterior RF coil array 550 each in a compressed state. In one example, the RF coil array 300 may be adjusted from the uncompressed state shown by FIG. 5 to the compressed state shown by FIG. 6 by flowing gases (e.g., air) out of the outer chamber 506 via the port 360 (shown by FIG. 3). For example, air may flow out of the outer chamber 506 in response to actuation of a vacuum pump coupled to the port 360 (e.g., coupled to one or more valves integrated with the port 360, as described above). The vacuum pump may be adjusted from a first mode in which the pump is off and does not flow air out of the outer chamber 506, to a second mode in which the pump is on (e.g., energized) and flows air out of the outer chamber 506 to atmosphere. Similarly, the posterior RF coil array 550 may be adjusted from the uncompressed state shown by FIG. 5 to the compressed state shown by FIG. 6 by a flowing gases out of the outer chamber 557 of the posterior RF coil array 550 via one or more ports of the posterior RF coil array 550 (e.g., via one or more valves integrated with the one or more ports of the posterior RF coil array 550, as described above). Adjusting the posterior RF coil array 550 to the compressed state may include coupling a vacuum pump (e.g., the same vacuum pump coupled to the port 360 described above, or a different vacuum pump) to the one or more ports of the posterior RF coil array 550 and adjusting the vacuum pump from the first mode (e.g., the non-operational mode in which the pump is off and does not flow air out of the outer chamber 557) to the second mode (e.g., the operational mode in which the pump is on and flows air out of the outer chamber 557).

Because the RF coil array 300 and the posterior RF coil array 550 are each formed of flexible materials as described above, flowing air out of the outer chamber of each RF coil array (e.g., outer chamber 506 and outer chamber 557) reduces an amount of space occupied by each outer chamber. Specifically, flowing air out of the outer chamber 506 reduces the size of the outer chamber 506 and decreases a distance between the first exterior surface 508 and the second exterior surface 510 (e.g., the thickness 518 shown by FIG. 5 and described above). Said another way, as gases (e.g., air) are removed from the outer chamber 506, the pressure of atmospheric air surrounding the exterior surfaces of the RF coil array 300 compresses the outer chamber 506 and presses the first exterior surface 508 toward the second exterior surface 510. Similarly, removing gases from the outer chamber 557 of the posterior RF coil array 550 reduces the size of the outer chamber 557 and causes the second exterior surface 563 of the posterior RF coil array 550 to move toward the first exterior surface 561.

Flowing air out of the outer chamber 506 of the RF coil array 300 in order to adjust the RF coil array 300 to the compressed state as described above causes the loose fill 512 of the RF coil array 300 to become compacted (e.g., compressed). For example, in the uncompressed state shown by FIG. 5 and described above, the particles of the loose fill 512 are free to move within the outer chamber 506. However, in the compressed state shown by FIG. 6, because the pressure of the outer chamber 506 is reduced below atmospheric pressure (e.g., by flowing air out of the outer chamber 506 to atmosphere via the vacuum pump), the first exterior surface 508 is pressed in a direction of the inner layer 506 by the pressure of atmospheric air surrounding the RF coil array 300. As the first exterior surface 508 is pressed toward the inner layer 506, the loose fill 512 within the outer chamber 506 is compressed between the inner layer 504 and the first exterior surface 508. Additionally, because the outer chamber 506 is reduced in size due to the flow of air out of the outer chamber 506, the particles of the loose fill 512 may not be free to move relative to each other during conditions in which the RF coil array 300 is in the compressed state.

Similarly, during conditions in which the posterior RF coil array 550 is in the compressed state, the second loose fill 554 of the posterior RF coil array 550 is compressed by the inner layer 552 and the second exterior surface 563 of the posterior RF coil array 550. Compressing the second loose fill 554 may reduce an amount of movement of the particles of the second loose fill 554 relative to each other, similar to the example of the loose fill 512 of the RF coil array 300 described above.

During conditions in which the RF coil array 300 is in the compressed state, a stiffness (e.g., a rigidity) of the RF coil array 300 may be increased due to the reduced amount of movement of the particles of the loose fill 512 relative to each other. For example, because the size of the outer chamber 506 is decreased due to the removal of gases from the outer chamber 506 via the vacuum pump, an amount of space between adjacent particles of the loose fill 512 may be decreased, thereby increasing a denseness of the loose fill 512 (e.g., a number of particles of the loose fill 512 per unit volume of the outer chamber 506). The increased denseness of the loose fill 512 may reduce a flexibility of the RF coil array 300 while the RF coil array 300 is in the compressed state. As described above, in some examples, the port 360 (shown by FIG. 3) may include one or more check valves configured to enable gases to flow out of the outer chamber 506 and to prevent gases from flowing into the outer chamber 506. In this configuration, the vacuum pump may flow air out of the outer chamber 506, and the outer chamber may be maintained at a pressure below atmospheric pressure by the one or more check valves. In order to adjust the RF coil array 300 from the compressed state to the uncompressed state, the RF coil array 300 may include one or more pressure relief valves. The one or more pressure relief valves may be normally closed valves that do not enable gases to flow into and/or out of the outer chamber 506 during conditions in which the one or more pressure relief valves are in a fully closed position. However, the one or more pressure relief valves may be actuated (e.g., electrically actuated via the processing system of the MRI system, physically actuated by an operator of the MRI system, etc.) and is adjusted from the fully closed position to an opened position in order to enable gases (e.g., atmospheric air) to flow into the outer chamber 506 of the RF coil array 300. The gases may flow into the outer chamber 506 of the RF coil array 300 in order to expand the outer chamber 506 and adjust the RF coil array 300 from the compressed state to the uncompressed state. Similarly, the posterior RF coil array 550 may include one or more similar pressure relief valves configured to enable the posterior RF coil array 550 to adjust from the compressed state to the uncompressed state (e.g., similar to the adjustment of the RF coil array 300 from the compressed state to the uncompressed state).

During conditions in which the RF coil array 300 is in the compressed state, the RF coils embedded within the inner layer 504 of the RF coil array 300 may be positioned closer to the body 559 of the patient 569 at the anterior end 531 of the body 559 of the patient 569 relative to conditions in which the RF coil array 300 is in the uncompressed state. Specifically, adjusting the RF coil array 300 from the uncompressed state to the compressed state (e.g., transitioning the RF coil array 300 from the uncompressed state to the compressed state) may reduce a number and/or size of the gaps 514 shown by FIG. 5 between the second exterior surface 510 and the body 559 of the patient 569. As the size of the outer chamber 506 is reduced, the particles of the loose fill 512 may move relative to each other in order to more closely conform to the body 559 of the patient 569. Similarly, the inner layer 504 and the second exterior surface 510 may each deform (e.g., bend and/or flex) in order to more closely conform to the body 559 of the patient 569. As the loose fill 512 is compressed between the inner layer 504 and the first exterior surface 508, the stiffness of the RF coil array 300 may be increased (as described above), thereby maintaining the inner layer 504, loose fill 512, and second exterior surface 510 in a relative arrangement that more closely conforms to the body 559 of the patient 569.

By adjusting the RF coil array 300 to the compressed state and conforming the RF coil array 300 to the body 559 of the patient 569 as described above, the RF coils of the RF coil array may be positioned closer to the body 559 of the patient 569, thereby increasing an imaging quality of the RF coil array 300. For example, images of the body 559 of the patient 569 produced by the MRI system via the RF coil array 300 may have an increased quality, clarity, etc., as the RF coils are positioned closer to the body 559 of the patient 569. In some examples, a signal-to-noise ratio of MR signals transmitted by the RF coils may be increased as the RF coils are positioned closer to the body 559 of the patient 569. In particular, the RF coils may be configured to receive radio-frequency signals emitted by the body of the patient (as described above with reference to the RF coils shown by FIGS. 1-2), and an intensity of radio-frequency signals received at the RF coils may increase as the RF coils are positioned closer to the body of the patient.

In the compressed state (e.g., the example shown by FIG. 6), one or more RF coils of the plurality of RF coils 316 may be positioned closer to the body 559 of the patient 569 than during conditions in which the RF coil array 300 is in the uncompressed state (e.g., the example shown by FIG. 5). For example, FIG. 5 shows the fifth RF coil 328 being positioned away from the body 559 of the patient 569 by the distance 520. However, FIG. 6 shows the fifth RF coil 328 being positioned away from the body 559 of the patient 569 by a distance 604, with the distance 604 being less than the distance 520. In one example, the distance 520 may be 25 millimeters, and the distance 604 may be 8 millimeters. The reduced distance 604 relative to the distance 520 results from the decreased size of the outer chamber 506 during conditions in which the RF coil array 300 is in the compressed state. For example, FIG. 5 shows the outer chamber 506 having thickness 516, and FIG. 6 shows the outer chamber 506 having thickness 602, with the thickness 602 being less than the thickness 516. Similarly, FIG. 5 shows the RF coil array having thickness 518, and FIG. 6 shows the RF coil array 300 having thickness 600, with the thickness 600 being less than the thickness 518. Additionally, the gaps 514 shown by FIG. 5 with the RF coil array 300 in the uncompressed state are greatly reduced in size during conditions in which the RF coil array is in the compressed state, as shown by FIG. 6.

Similarly, in the compressed state, the RF coils of the posterior RF coil array 550 are positioned closer to the body 559 of the patient 569 (e.g., the posterior end 533 of the patient). The gaps 565 between the first exterior surface 561 of the posterior RF coil array 550 and the body 559 of the patient 569 during conditions in which the posterior RF coil array 550 is in the uncompressed state (as shown by FIG. 5) are greatly reduced during conditions in which the posterior RF coil array 550 is in the compressed state (as shown by FIG. 6). As a result, during conditions in which the posterior RF coil array 550 is in the compressed state and the RF coil array 550 closely conforms to the body 559 of the patient 569 at the posterior end 533 of the patient, an imaging quality of the posterior RF coil array 550 may be increased.

Although the RF coil array 300 and posterior RF coil array 550 are described herein as having adjustable thicknesses via adjustment of the gas pressure within the outer chamber 506 and outer chamber 557, respectively, in some examples the RF coil array 300 and/or posterior RF coil array 550 may not include outer chambers. For example, the RF coil array 300 and/or posterior RF coil array 550 may instead include one or more layers of flexible padding, foam, and the like, in lieu of their respective outer chambers (e.g., with the one or more layers positioned between inner layer 506 and first exterior surface 508, and/or positioned between inner layer 552 and second exterior surface 563).

Figure 7:
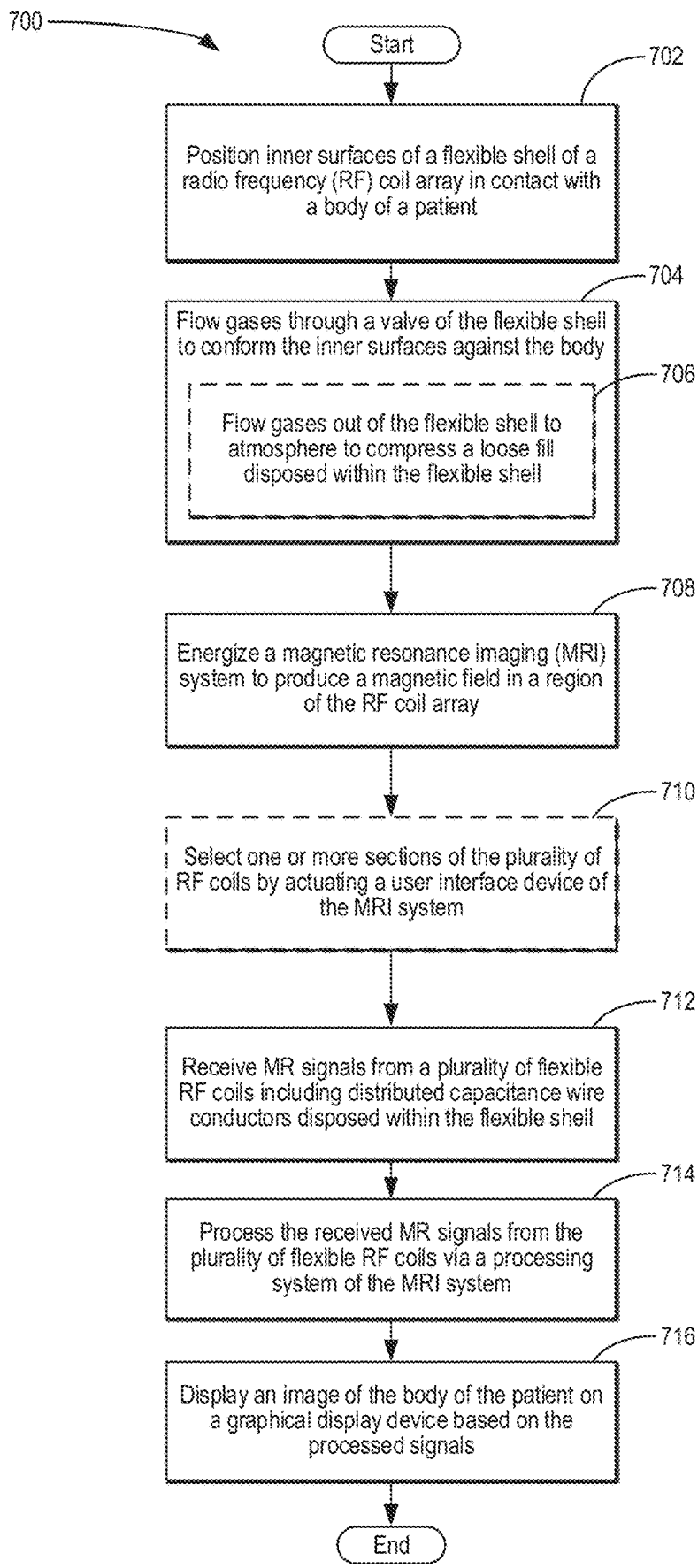
FIG. 7 illustrates a method for imaging a patient via an MRI system and an RF coil array including a plurality of RF coils having distributed capacitance wire conductors, according to an embodiment.

FIG. 7 shows a method 700 for imaging a body of a patient (e.g., body 559 of the patient 569 shown by FIGS. 5-6) via an MRI system and one or more RF coil arrays (e.g., similar to the RF coil array 300, RF coil array 400, and posterior RF coil array 550 described above). The RF coils included by the one or more RF coil arrays may be flexible RF coils having distributed capacitance wire conductors, such as the examples described above, and the examples described below with reference to FIGS. 8-14. In one example, the MRI system may be similar to the MRI system 10 shown by FIG. 1, the MRI system 200 shown by FIG. 2, and the like.

At 702, the method includes positioning inner surfaces of a flexible shell of an RF coil array in contact with the body of the patient. In one example, the flexible shell may be the shell 571 including inner layer 504 shown by FIGS. 5-6 and described above and/or the shell 572 including inner layer 552 shown by FIGS. 5-6 and described above, and the inner surfaces may include the second exterior surface 510 shown by FIGS. 5-6 and described above and/or the first exterior surface 561 shown by FIGS. 5-6 and described above. As described here with reference to 702, the inner surfaces are surfaces of the RF coil array configured to be positioned in contact with the body of the patient and are not surfaces positioned within an interior of the RF coil array. For example, the inner surfaces may include the second exterior surface 510 positioned in contact with the body of the patient at the anterior end 531 of the patient. Additionally and/or alternately, the first exterior surface 561 of the posterior RF coil array 550 may be positioned in contact with the body of the patient at the posterior end 533 of the patient.

The inner surfaces are positioned in contact with the body during conditions in which the body of the patient is supported by a table of the MRI system (e.g., the table 26 shown by FIG. 1 and described above, table 214 shown by FIG. 2, and the like). For example, the posterior RF coil array 550 may be positioned on the table of the MRI system, and the patient may lay on the posterior RF coil array in order to position the inner surfaces of the posterior RF coil array in contact with the body of the patient at the posterior end of the patient. Additionally and/or alternately, the patient may lay on the table of the MRI system (or on the posterior RF coil array) so that the body of the patient is in a prone position, and the RF coil array (e.g., RF coil array 300 shown by FIG. 3 and FIGS. 5-6, and described above) may be positioned over the anterior end of the patient. Inner surfaces of the RF coil array (e.g., second exterior surface 510 shown by FIGS. 5-6 and described above) may be positioned in contact with the body of the patient at the anterior end of the patient.

The method continues from 702 to 704, where the method includes flowing gases through a valve of the flexible shell to conform the inner surfaces against the body. For example, as described above with reference to the RF coil array 300 shown by FIG. 3 and FIGS. 5-6, the RF coil array may include one or more ports fluidly coupling an outer chamber of the RF coil array (e.g., outer chamber 506 shown by FIGS. 5-6 and described above) to atmosphere via one or more valves integrated with the one or more ports. In one example, the method at 704 includes flowing gases out of the flexible shell to atmosphere to compress a loose fill disposed within the flexible shell, as shown at 706. The gases may flow out of the outer chamber through the one or more ports to atmosphere in order to decrease a pressure within the outer chamber and conform the inner surfaces against the body. As described above with reference to the uncompressed state shown by FIG. 5 and the compressed state shown by FIG. 6, flowing gases out of the outer chamber via the one or more ports (e.g., by coupling a vacuum pump to the one or more ports and energizing the vacuum pump to flow the gases through one or more valves integrated with the one or more ports and out of the outer chamber) may adjust the RF coil array from the uncompressed state to the compressed state. As the RF coil array is adjusted from the uncompressed state to the compressed state, a loose fill disposed within the outer chamber of the RF coil array (e.g., loose fill 512 shown by FIGS. 5-6 and described above) may be compacted by the RF coil array such that particles of the loose fill are positioned in an arrangement conforming to the patient's body. Additionally, the inner surfaces of the RF coil array (e.g., the first exterior surface 508 and the second exterior surface 510 of the RF coil array 300 shown by FIGS. 5-6) may deform (e.g., bend, fold, etc.) to approximate a shape of the patient's body at the anterior end of the patient. In examples in which the RF coil array is a posterior RF coil array (e.g., the posterior RF coil array 550 shown by FIGS. 5-6 and described above), the inner surfaces of the RF coil array may conform against the body of the patient in a similar way (e.g., by flowing gases out of an outer chamber of the RF coil array and to atmosphere).

In other examples, the method at 704 may include conforming inner surfaces against the body of the patient by flowing gases into the shell from a gas source (e.g., atmosphere) to expand the outer chamber within the RF coil array. Specifically, air may flow into the outer chamber of the RF coil array in order to increase the pressure of the outer chamber to a pressure above a pressure of atmospheric air surrounding the inner surfaces of the RF coil array (e.g., at an exterior of the RF coil array). Increasing the pressure of the outer chamber (e.g., a pressure of gases within the outer chamber) may increase a rigidity of the RF coil array in order to maintain the inner surfaces of the RF coil array in contact with the body of the patient. By maintaining the inner surfaces of the RF coil array in contact with the body of the patient, the RF coils of the RF coil array may be positioned closer to the body of the patient.

The method continues to 708 where the method includes energizing the magnetic resonance imaging (MRI) system to produce a magnetic field in a region of the RF coil array. In one example, the MRI system may include an electromagnet configured to produce a uniform magnetic field (as described above with reference to MRI system 10 shown by FIG. 1). At 708, the electromagnet is energized to produce the uniform magnetic field in the region of the RF coil array (e.g., within a tunnel of the MRI system). For example, the patient may be positioned on the table of the MRI system and the RF coil array may be coupled to the patient as described above. The table may then be moved into the tunnel of the MRI system and the electromagnet may be energized in order to produce a uniform magnetic field in the region of the RF coil array and the patient. The uniform magnetic field may polarize the molecular spins of hydrogen molecules within the body of the patient and may align the spins with a direction of the uniform magnetic field.

Magnetic gradient coils in the MRI system produce spatially-varying magnetic fields to spatially encode the region by creating a signature resonance frequency of the hydrogen nuclei at different locations in the body of the patient. RF coil assemblies are then used to create pulses of RF energy at or near the resonance frequency of the hydrogen nuclei. The pulses of RF energy are absorbed by the hydrogen nuclei, thereby adding energy to the nuclear spin system and adjusting the hydrogen nuclei from a rest state to an excited state. As the hydrogen nuclei relax back to the rest state from the excited state, they release the absorbed energy in the form of an RF signal, which can be detected at the RF receive coils (e.g., RF coils shown in FIGS. 3-6).

At 710, the method optionally includes selecting one or more sections of the plurality of RF coils of the RF coil array by actuating a user interface device of the MRI system. For example, an operator of the MRI system may input a selection into the user interface device (e.g., a computer terminal, keyboard, touchscreen, etc.) of the MRI system in order to select one or more sections of the RF coil array (e.g., the first section 302, the second section 304, and/or the third section 306 of the RF coil array 300, the first section 430 and/or the second section 432 of the RF coil array 400 shown by FIG. 4, etc.). The RF coils included within the selected sections of the RF coil array may be the only RF coils that transmit MR signals to the processing system of the MRI system. In another example, the operator may adjust the selected sections to a deactivated mode in which MR signals are not transmitted to the processing system of the MRI system by the RF coils of the selected sections.

By selecting the sections of the RF coil array to selectively transmit signals from only one or more sections of the RF coil array to the processing system of the MRI system, a scan time of the patient may be reduced (e.g., as described above with reference to FIG. 3). For example, by transmitting MR signals to the processing system of the MRI system from only one or more selected sections of the RF coil array, an amount of data to be processed by the processing system of the MRI system to produce an image of the patient may be reduced, and the processing speed may be increased. However, step 710 is an optional step and in some examples, MR signals may be transmitted to the processing system from every RF coil of the RF coil array (e.g., the operator may not select one or more sections of the RF coil array to transmit signals to the processing system from only the one or more sections).

The method continues to 712 where the method includes receiving MR signals from the plurality of flexible RF coils including distributed capacitance wire conductors disposed within the flexible shell. As described above, the RF coils of the RF coil array may transmit MR signals to the controller unit or processing system of the MRI system, and the processing system may process the MR signals into an image of the patient. At 712, the MR signals are received by the processing system of the MRI system from the RF coils of the RF coil array. As described above with reference to FIG. 3, the RF coils included within the RF coil array are flexible RF coils including distributed capacitance wire conductors. Flexible RF coils may be movable relative to each other and have variable amounts of overlap with each other while the MR signals transmitted to the processing system by the RF coils are not degraded by different amounts of overlap of the RF coils with each other. For example, RF coils positioned at a center of a torso of the patient may have a first amount of overlap with adjacent RF coils, and RF coils positioned at a center of a pelvis of the patient may have a second amount of overlap with adjacent RF coils, with the second amount being different than the first amount. However, MR signals transmitted to the processing system of the MRI system by the RF coils positioned at the center of the torso of the patient are not degraded relative to MR signals transmitted to the processing system of the MRI system by the RF coils positioned at the center of the pelvis of the patient. Said another way, an image quality (e.g., clarity, resolution, sharpness, etc.) of an image of the torso of the patient produced by the processing system in response to the MR signals transmitted to the processing system by the RF coils positioned at the torso of the patient may be the same image quality as an image of the pelvis of the patient produced by the processing system in response to the MR signals transmitted to the processing system by the RF coils positioned at the pelvis of the patient, even under situations where the RF coils positioned at the torso of the patient have a different amount of overlap than the RF coils positioned at the pelvis of the patient.

At 714, the method includes processing the received MR signals from a plurality of flexible RF coils via the processing system of the MRI system. As described above, the processing system of the MRI system receives MR signals from the RF coils of the RF coil array and processes the MR signals into an image of the patient. The image of the patient may include details of various internal anatomical features of the patient (e.g., relative positions of bones, organs, etc.).

The method continues to 716 where the method includes displaying the image of the body of the patient on a graphical display device based on the processed signals. For example, the graphical display device may be a computer monitor, touchscreen, etc., and the image of the body of the patient may be displayed on the graphical display device. The processing system of the MRI system receives MR signals from the RF coil array and processes the MR signals into image data to be displayed by the graphical display device. In one example, the processing system may receive MR signals from the RF coil array (e.g., via one or more multiplexers of the RF coil array) and may process the MR signals to generate an electrical signal transmitted from the controller to the graphical display device, with the signal transmitted to the display device including grayscale or color values assigned to each pixel of the graphical display device. Additionally, the processing system may store a record of the MR signals received by the RF coil array in non-transitory memory of the controller.

In another example, the shell 571 of the RF coil array 300 illustrated in FIGS. 5 and 6 may not include an open chamber (e.g., outer chamber 506), but instead may be comprised of soft flexible material or padding to aid in the comfort of the subject being imaged. For example, the soft flexible material or padding may be positioned adjacent to inner layer 504, between inner layer 504 and the first exterior surface 508. The posterior RF coil array 550 may include a similar configuration (e.g., with the soft flexible material or padding being positioned between inner layer 552 and second exterior surface 563).

Figure 8:
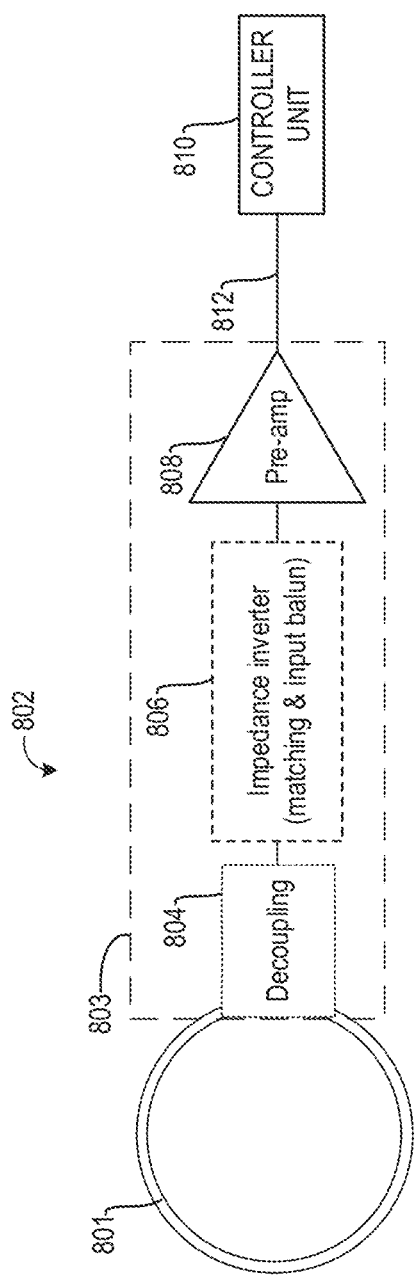
FIG. 8 schematically shows an example RF coil of an RF coil array coupled to a controller unit.

Turning now to FIG. 8, a schematic view of an RF coil 802 including a loop portion 801 coupled to a controller unit 810 via coupling electronics portion 803 and a coil-interfacing cable 812 is shown. In one example, the RF coil may be a surface receive coil, which may be single- or multi-channel. The RF coil 802 is one non-limiting example of RF coil unit 14 of FIG. 1 (e.g., similar to the other RF coil arrays described herein, such as first RF coil array 210, second RF coil array 212, RF coil array 300, RF coil array 400, and posterior RF coil array 550) and as such may operate at one or more frequencies in the MRI apparatus 10, MRI system 200, and the like. The coil-interfacing cable 812 may be a coil-interfacing cable extending between the electronics portion 803 and an interfacing connector of an RF coil array or a RF coil array interfacing cable extending between the interfacing connector of the RF coil array and the MRI system controller unit 810. The controller unit 810 may be associated with and/or may be a non-limiting example of the data processing unit 31 or controller unit 25 in FIG. 1.

The RF coil of the present disclosure uses a significantly smaller amount of copper, printed circuit board (PCB) material and electronic components than what is used in a conventional RF coil. The RF coil disclosed herein may include paralleled elongated wire conductors, encapsulated and separated by a dielectric material, forming the coil element. The parallel wires form a low reactance structure without need for discrete capacitors. The minimal conductor, sized to keep losses tolerable, eliminates much of the capacitance between coil loops, and reduces electric field coupling. By interfacing with a large sampling impedance, currents are reduced and magnetic field coupling is minimized. The electronics are minimized in size and content to keep mass and weight low and prevent excessive interaction with the desired fields. Packaging can now be extremely flexible which allows contouring to anatomy, optimizing signal to noise ratio (SNR) and imaging acceleration.

A traditional RF receive coil for MR is comprised of several conductive intervals joined between themselves by capacitors. By adjusting the capacitors' capacitances, the impedance of the RF coil may be brought to its minimal value, usually characterized by low resistance. At resonant frequency, stored magnetic and electric energy alternate periodically. Each conductive interval, due to its length and width, possesses a certain self-capacitance, where electric energy is periodically stored as static electricity. The distribution of this electricity takes place over the entire conductive interval length of the order of 5-15 cm, causing similar range electric dipole field. In a proximity of a large dielectric load, self-capacitance of the intervals change—hence detuning of the coil. In case of a lossy dielectric, dipole electric field causes Joule dissipation characterized by an increase overall resistance observed by the coil.

In contrast, the RF coil of the present disclosure represents almost an ideal magnetic dipole antenna as its common mode current is uniform in phase and amplitude along its perimeter. The capacitance of the RF coil is built between the two wires along the perimeter of the loop. The conservative electric field is strictly confined within the small cross-section of the two parallel wires and dielectric filler material. In the case of two RF coil loops overlapping, the parasitic capacitance at the cross-overs is greatly reduced in comparison to two overlapped copper traces of traditional RF coils. RF coil thin cross-sections allows better magnetic decoupling and reduces or eliminates critical overlap between two loops in comparison to two traditional trace-based coil loops.

The coupling electronics portion 803 may be coupled to the loop portion of the RF coil 802. Herein, the coupling electronics portion 803 may include a decoupling circuit 804, impedance inverter circuit 806, and a pre-amplifier 808. The decoupling circuit 804 may effectively decouple the RF coil during a transmit operation. Typically, the RF coil 802 in its receive mode may be coupled to a body of a subject being imaged by the MR apparatus in order to receive echoes of the RF signal transmitted during the transmit mode. If the RF coil 802 is not used for transmission, then it may be necessary to decouple the RF coil 802 from the RF body coil while the RF body coil is transmitting the RF signal. The decoupling of the receive coil from the transmit coil may be achieved using resonance circuits and PIN diodes, microelectromechanical systems (MEMS) switches, or another type of switching circuitry. Herein, the switching circuitry may activate detuning circuits operatively connected to the RF coil 802.

The impedance inverter circuit 806 may form an impedance matching network between the RF coil 802 and the pre-amplifier 808. The impedance inverter circuit 806 is configured to transform a coil impedance of the RF coil 802 into an optimal source impedance for the pre-amplifier 808. The impedance inverter circuit 806 may include an impedance matching network and an input balun. The pre-amplifier 808 receives MR signals from the corresponding RF coil 802 and amplifies the received MR signals. In one example, the pre-amplifier may have a low input impedance that is configured to accommodate a relatively high blocking or source impedance. Additional details regarding the RF coil and associated coupling electronics portion will be explained in more detail below with respect to FIGS. 9 and 10. The coupling electronics portion 803 may be packaged in a very small PCB approximately 2 cm² in size or smaller. The PCB may be protected with a conformal coating or an encapsulating resin.

The coil-interfacing cable 812, such as an RF coil array interfacing cable, may be used to transmit signals between the RF coils and other aspects of the processing system, for example to control the RF coils and/or to receive information from the RF coils. The RF coil array interfacing cables may be disposed within the bore or imaging space of the MR apparatus (such as MRI apparatus 10 of FIG. 1) and subjected to electro-magnetic fields produced and used by the MRI apparatus. In MRI systems, coil-interfacing cables, such as coil-interfacing cable 812, may support transmitter-driven common-mode currents, which may in turn create field distortions and/or unpredictable heating of components. Typically, common-mode currents are blocked by using baluns. Baluns or common-mode traps provide high common-mode impedances, which in turn reduces the effect of transmitter-driven currents.

Thus, coil-interfacing cable 812 may include one or more baluns. In traditional coil-interfacing cables, baluns are positioned with a relatively high density, as high dissipation/voltages may develop if the balun density is too low or if baluns are positioned at an inappropriate location. However, this dense placement may adversely affect flexibility, cost, and performance. As such, the one or more baluns in the coil-interfacing cable may be continuous baluns to ensure no high currents or standing waves, independent of positioning. The continuous baluns may be distributed, flutter, and/or butterfly baluns. Additional details regarding the coil-interfacing cable and baluns will be presented below with respect to FIGS. 12-14.

Figure 9A:
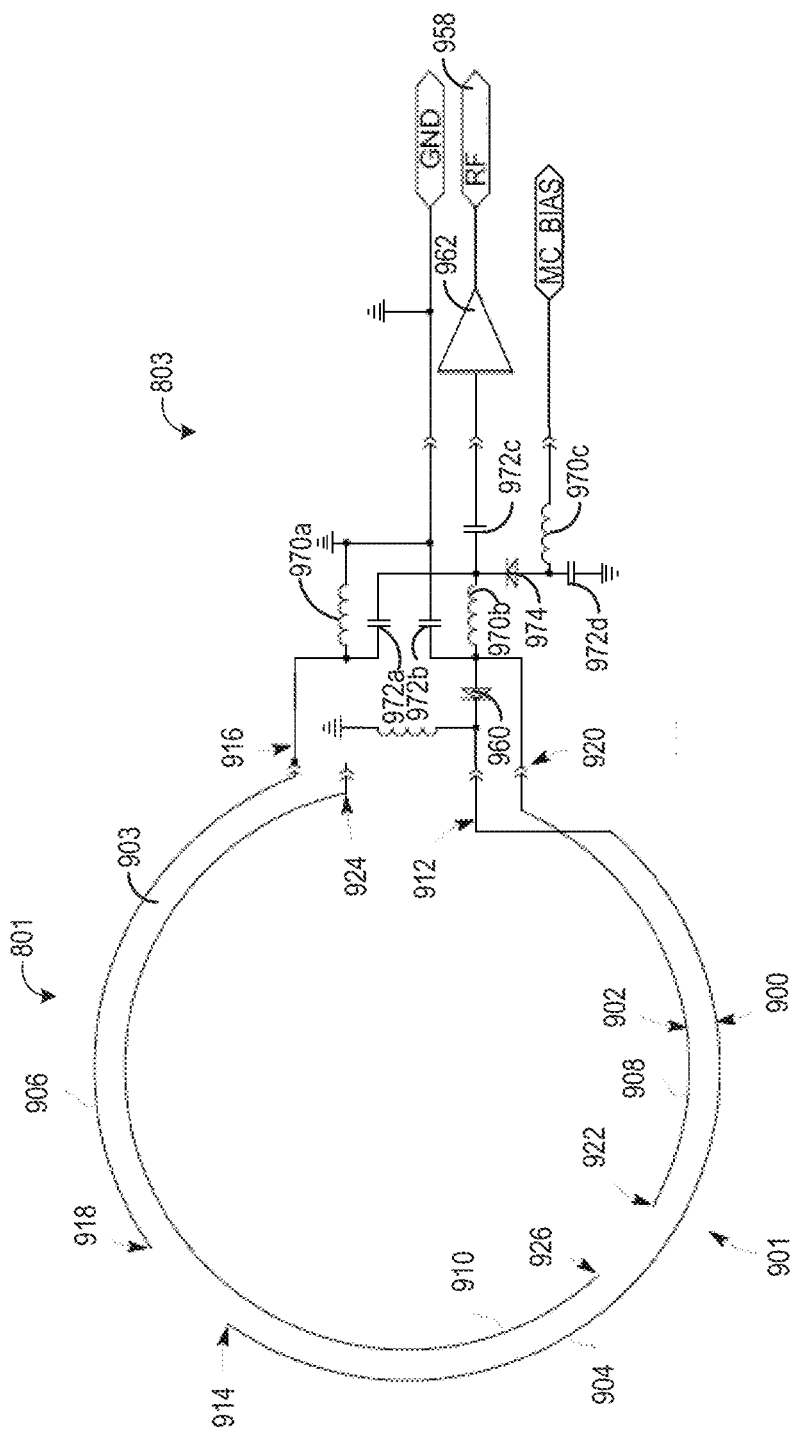
FIG. 9A shows a first example RF coil of an RF coil array and associated coupling electronics.

FIG. 9A is a schematic of an RF coil 901 having segmented conductors formed in accordance with an embodiment. RF coil 901 is a non-limiting example of RF coil 802 of FIG. 8 and as such includes loop portion 801 and coupling electronics portion 803 of RF coil 802. The coupling electronics portion allows the RF coil to transmit and/or receive RF signals when driven by the data acquisition unit 124 (shown in FIG. 1). In the illustrated embodiment, the RF coil 901 includes a first conductor 900 and a second conductor 902. The first and second conductors 900, 902 may be segmented such that the conductors form an open circuit (e.g., form a monopole). The segments of the conductors 900, 902 may have different lengths, as is discussed below. The length of the first and second conductors 900, 902 may be varied to achieve a desired distributed capacitance, and accordingly, a desired resonance frequency.

The first conductor 900 includes a first segment 904 and a second segment 906. The first segment 904 includes a driven end 912 at an interface terminating to coupling portion electronics 803, which will be described in more detail below. The first segment 904 also includes a floating end 914 that is detached from a reference ground, thereby maintaining a floating state. The second segment 906 includes a driven end 916 at the interface terminating to the coupling electronics portion and a floating end 918 that is detached from a reference ground.

The second conductor 902 includes a first segment 908 and a second segment 910. The first segment 908 includes a driven end 920 at the interface. The first segment 908 also includes a floating end 922 that is detached from a reference ground, thereby maintaining a floating state. The second segment 910 includes a driven end 924 at the interface, and a floating end 926 that is detached from a reference ground. The driven end 924 may terminate at the interface such that end 924 is only coupled to the first conductor through the distributed capacitance. The capacitors shown around the loop between the conductors represent the capacitance between the wires.

The first conductor 900 and the second conductor 902 exhibit a distributed capacitance along the length of the first and second segments 904, 906, 908, 910. The first segments 904, 908 may have a different length than the second segments 906, 910. The relative difference in length between the first segments 904, 908 and the second segments 906, 910 may be used to produce an effective LC circuit have a resonance frequency at the desired center frequency. For example, by varying the length of the first segments 904, 908 relative to the lengths of the second segments 906, 910, an integrated distributed capacitance may be varied.

In the illustrated embodiment, the first and second conductors 900, 902 are shaped into a loop portion that terminates to an interface. But in other embodiments, other shapes are possible. For example, the loop portion may be a polygon, shaped to conform the contours of a surface (e.g., housing), and/or the like. The loop portion defines a conductive pathway along the first and second conductors. The first and second conductors are void of any discrete or lumped capacitive or inductive elements along an entire length of the conductive pathway. The loop portion may also include loops of varying gauge of stranded or solid conductor wire, loops of varying diameters with varying lengths of the first and second conductors 900, 902, and/or loops of varying spacing between the first and second conductors. For example, each of the first and second conductors may have no cuts or gaps (no segmented conductors) or one or more cuts or gaps (segmented conductors) at various locations along the conductive pathway.

Distributed capacitance (DCAP), as used herein, represents a capacitance exhibited between conductors along the length of the conductors and is void of discrete or lumped capacitive components and discrete or lumped inductive components. In the examples herein, the capacitance may grow in an even and uniform manner along the length of the first and second conductors 900, 902.

A dielectric material 903 encapsulates and separates the first and second conductors 900, 902. The dielectric material 903 may be selectively chosen to achieve a desired distributive capacitance. The dielectric material 903 may be based on a desired permittivity $\epsilon$ to vary the effective capacitance of the loop portion. For example, the dielectric material 903 may be air, rubber, plastic, or any other dielectric material. In one example, the dielectric material may be polytetrafluoroethylene (pTFE). For example, the dielectric material 903 may be an insulating material surrounding the parallel conductive elements of the first and second conductors 900, 902. Alternatively, the first and second conductors 900, 902 may be twisted upon one another to form a twisted pair cable. As another example, the dielectric material 903 may be a plastic material. The first and second conductors 900, 902 may form a coaxial structure in which the plastic dielectric material 903 separates the first and second conductors. As another example, the first and second conductors may be configured as planar strips.

The coupling electronics 803 is operably and communicatively coupled to the RF driver unit 22, the data acquisition unit 124, controller unit 25, and/or data processing unit 31 to allow the RF coil 802 to transmit and/or receive RF signals. In the illustrated embodiment, the coupling electronics 803 includes a signal interface 958 configured to transmit and receive the RF signals.

As explained above with reference to FIG. 8, the coupling electronics 803 includes a decoupling circuit, impedance inverter circuit, and pre-amplifier. As illustrated in FIG. 9, the decoupling circuit includes a decoupling diode 960. The decoupling diode 960 may be provided with voltage from MC_BIAS, for example, in order to turn decoupling diode 960 on. When on, decoupling diode 960 causes conductor 900 to short with conductor 902, thus causing the coil be off-resonance and hence decouple the coil during a transmit operation, for example.

The impedance inverter circuit includes a plurality of inductors, including first inductor 970a, second inductor 970b, and third inductor 970c; a plurality of capacitors, including first capacitor 972a, a second capacitor 972b, a third capacitor 972c, and a fourth capacitor 972d; and a diode 974. The impedance inverter circuit includes matching circuitry and an input balun. As shown, the input balun is a lattice balun that comprises first inductor 970a, second inductor 970b, first capacitor 972a, and second capacitor 972b. In one example, diode 974 limits the direction of current flow to block RF receive signals from proceeding into decoupling bias branch (MC_BIAS).

In one example, the RF, GND, and MC_BIAS connections are part of a single cable. For example, the cable may be a triaxial cable with a center conductor and two surrounding shields. The center conductor may electrically conduct the RF signal and pre-amp control, a first shield may be the GND connection (e.g., ground), and a second, outermost shield may be the MC_BIAS connection (e.g., multi-coil bias for diode decoupling control). The cable may connect to an interface board (along with one or more other cables of RF coils), with a connector of the interface board electrically coupling the cable to the MRI system.

The pre-amplifier 962 may be a low input impedance pre-amplifier that is optimized for high source impedance by the impedance matching circuitry. The pre-amplifier may have a low noise reflection coefficient, γ, and a low noise resistance, Rn. In one example, the pre-amplifier may have a source reflection coefficient of γ substantially equal to 0.0 and a normalized noise resistance of Rn substantially equal to 0.0 in addition to the low noise figure. However, γ values substantially equal to or less than 0.1 and Rn values substantially equal to or less than 0.2 are also contemplated. With the pre-amplifier having the appropriate γ and Rn values, the pre-amplifier provides a blocking impedance for RF coil 901 while also providing a large noise circle in the context of a Smith Chart. As such, current in RF coil 901 is minimized, the pre-amplifier is effectively noise matched with RF coil 901 output impedance. Having a large noise circle, the pre-amplifier yields an effective SNR over a variety of RF coil impedances while producing a high blocking impedance to RF coil 901.

In some examples, the pre-amplifier 962 may include an impedance transformer that includes a capacitor and an inductor. The impedance transformer may be configured to alter the impedance of the pre-amplifier to effectively cancel out a reactance of the pre-amplifier, such as capacitance caused by a parasitic capacitance effect. Parasitic capacitance effects can be caused by, for example, a PCB layout of the pre-amplifier or by a gate of the pre-amplifier. Further, such reactance can often increase as the frequency increases. Advantageously, however, configuring the impedance transformer of the pre-amplifier to cancel, or at least minimize, reactance maintains a high impedance (i.e. a blocking impedance) to RF coil 901 and an effective SNR without having a substantial impact on the noise figure of the pre-amplifier. The lattice balun described above may be a non-limiting example of an impedance transformer.

In examples, the pre-amplifier described herein may be a low input pre-amplifier. For example, in some embodiments, a "relatively low" input impedance of the preamplifier is less than approximately 5 ohms at resonance frequency. The coil impedance of the RF coil 901 may have any value, which may be dependent on coil loading, coil size, field strength, and/or the like. Examples of the coil impedance of the RF coil 901 include, but are not limited to, between approximately 2 ohms and approximately 10 ohms at 1.5 T magnetic field strength, and/or the like. The impedance inverter circuitry is configured to transform the coil impedance of the RF coil 901 into a relatively high source impedance. For example, in some embodiments, a "relatively high" source impedance is at least approximately 100 ohms and may be greater than 150 ohms.

The impedance transformer may also provide a blocking impedance to the RF coil 901. Transformation of the coil impedance of the RF coil 901 to a relative high source impedance may enable the impedance transformer to provide a higher blocking impedance to the RF coil 901. Exemplary values for such higher blocking impedances include, for example, a blocking impedance of at least 500 ohms, and at least 1000 ohms.

Figure 9B:
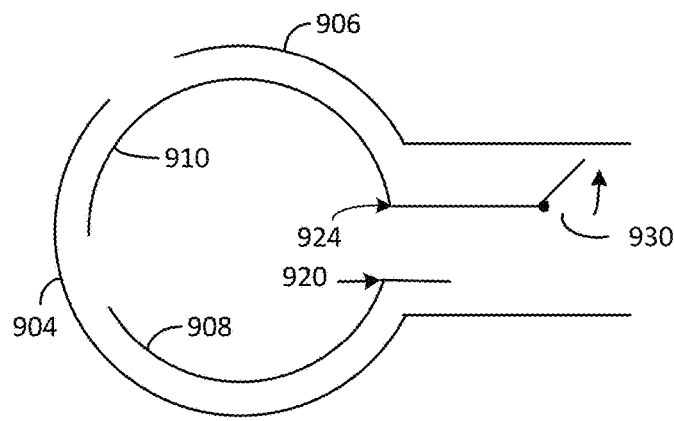
FIG. 9B shows a decoupling configuration according to another exemplary embodiment.
Figure 9C:
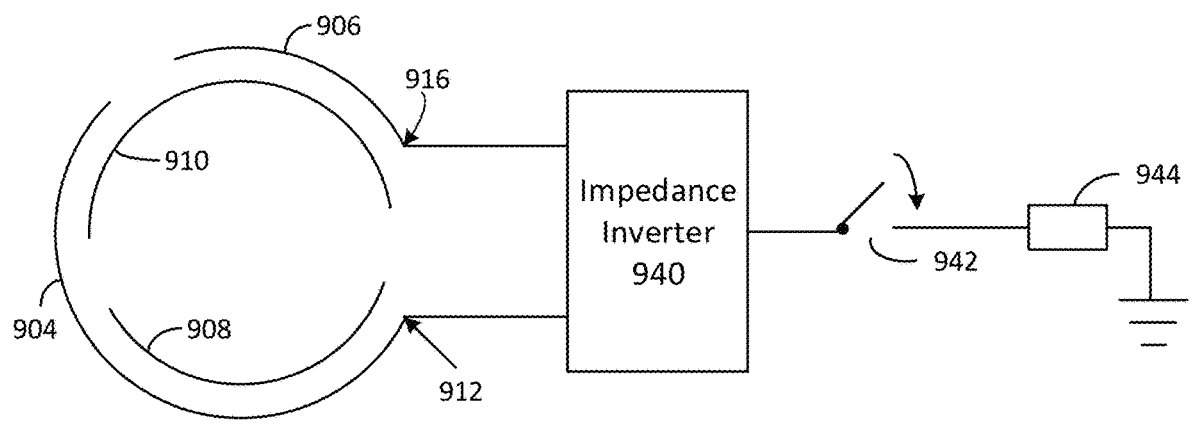
FIG. 9C shows a decoupling configuration according to yet another exemplary embodiment.

The decoupling circuit may be configured differently. FIGS. 9B and 9C show two decoupling configurations that are different than the decoupling circuit in FIG. 9A, according to exemplary embodiments. In FIG. 9B, a switch 930 (e.g., MEMS switch) is used in lieu of the decoupling diode 960 to decouple the RF coil in the transmit operation. The switch 930 is connected to the driven end 924 of segment 910. During transmit, the switch 930 is moved from an open state to a closed state (as indicated by the arrow in FIG. 9B), which causes segment 910 to short with segment 906, thus causing the coil off-resonant and hence restricting the current in the loop. In some embodiments, a switch may be connected to the driven end 920 that shorts segment 908 with segment 904 during transmit operation. In some embodiments, two switches may be connected to the driven ends 924 and 920 separately to short out the respective segments during transmit operation.

In FIG. 9C, an impedance inverter 940 is connected between the driven ends 912 and 916. The impedance inverter 940 can generate a high impedance (e.g., resistive or reactive) across the driven ends 912 and 916. The impedance inverter 940 is grounded through a switch 942 (e.g., MEMS switch) and a low impedance element 944. During transmit operation, the switch 942 is moved from an open state to a closed state (as indicated by the arrow in FIG. 9C), which connects the impedance inverter 940 to segments 904 and 906, thus increasing the impedance of the loop to a high level and restricting the current in the loop.

Figure 10:
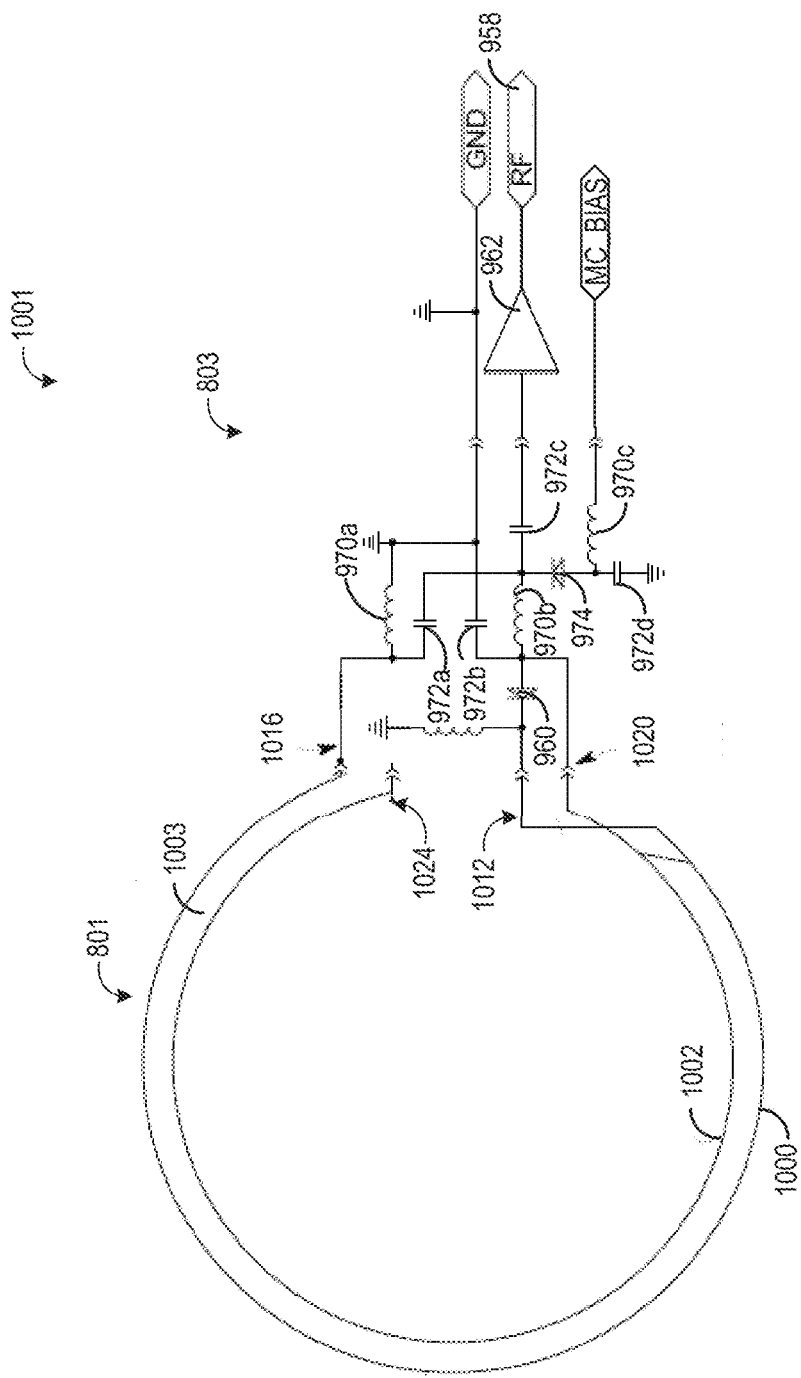
FIG. 10 shows a second example RF coil of an RF coil array and associated coupling electronics.

FIG. 10 is a schematic of an RF coil 1001 and coupling electronics 803 according to another embodiment. The RF coil of FIG. 10 is a non-limiting example of the RF coil and coupling electronics of FIG. 8, and as such includes a loop portion 801 and coupling electronics portion 803. The coupling electronics allows the RF coil to transmit and/or receive RF signals when driven by the data acquisition unit 124 (shown in FIG. 1). The RF coil 1001 includes a first conductor 1000 in parallel with a second conductor 1002. At least one of the first and second conductors 1000, 1002 are elongated and continuous.

In the illustrated embodiment, the first and second conductors 1000, 1002 are shaped into a loop portion that terminates to an interface. But in other embodiments, other shapes are possible. For example, the loop portion may be a polygon, shaped to conform the contours of a surface (e.g., housing), and/or the like. The loop portion defines a conductive pathway along the first and second conductors 1000, 1002. The first and second conductors 1000, 1002 are void of any discrete or lumped capacitive or inductive components along an entire length of the conductive pathway. The first and second conductors 1000, 1002 are uninterrupted and continuous along an entire length of the loop portion. The loop portion may also include loops of varying gauge of stranded or solid conductor wire, loops of varying diameters with varying lengths of the first and second conductors 1000, 1002, and/or loops of varying spacing between the first and second conductors. For example, each of the first and second conductors may have no cuts or gaps (no segmented conductors) or one or more cuts or gaps (segmented conductors) at various locations along the conductive pathway.

The first and second conductors 1000, 1002 have a distributed capacitance along the length of the loop portion (e.g., along the length of the first and second conductors 1000, 1002). The first and second conductors 1000, 1002 exhibit a substantially uniform capacitance along the entire length of the loop portion. Distributed capacitance (DCAP), as used herein, represents a capacitance exhibited between conductors along the length of the conductors and is void of discrete or lumped capacitive components and discrete or lumped inductive components. In the examples herein, the capacitance may grow in an even and uniform manner along the length of the first and second conductors 1000, 1002. At least one of the first and second conductors 1000, 1002 are elongated and continuous. In the illustrated embodiment, both the first and second conductors 1000, 1002 are elongated and continuous. But in other embodiments, only one of the first or second conductors 1000, 1002 may be elongated and continuous. The first and second conductors 1000, 1002 form continuous distributed capacitors. The capacitance grows at a substantially constant rate along the length of the conductors 1000, 1002. In the illustrated embodiment, the first and second conductors 1000, 1002 forms an elongated continuous conductors that exhibits DCAP along the length of the first and second conductors 1000, 1002. The first and second conductors 1000, 1002 are void of any discrete capacitive and inductive components along the entire length of the continuous conductors between terminating ends of the first and second conductors 1000, 1002. For example, the first and second conductors 1000, 1002 does not include any discrete capacitors, nor any inductors along the length of the loop portion.

A dielectric material 1003 separates the first and second conductors 1000, 1002. The dielectric material 1003 may be selectively chosen to achieve a desired distributive capacitance. The dielectric material 1003 may be based on a desired permittivity $\epsilon$ to vary the effective capacitance of the loop portion. For example, the dielectric material 1003 may be air, rubber, plastic, or any other dielectric material. In one example, the dielectric material may be polytetrafluoroethylene (pTFB). For example, the dielectric material 1003 may be an insulating material surrounding the parallel conductive elements of the first and second conductors 1000, 1002. Alternatively, the first and second conductors 1000, 1002 may be twisted upon one another to from a twisted pair cable. As another example, the dielectric material 1003 may be a plastic material. The first and second conductors 1000, 1002 may form a coaxial structure in which the plastic dielectric material 1003 separates the first and second conductors 1000, 1002. As another example, the first and second conductors 1000, 1002 may be configured as planar strips.

The first conductor 1000 includes a first terminating end 1012 and a second terminating end 1016 that terminates at the interface. The first terminating end 1012 is coupled to the coupling electronics 803. The first terminating end 1012 may also be referred to herein as a "driven end." The second terminating end 1016 is also referred to herein as a "second driven end."

The second conductor 1002 includes a first terminating end 1020 and a second terminating end 1024 that terminates at the interface. The first terminating end 1020 is coupled to the coupling electronics 803. The first terminating end 1020 may also be referred to herein as a "driven end." The second terminating end 1024 is also referred to herein as a "second driven end."

The loop portion 801 of the RF coil 1001 is coupled to coupling electronics 803. The coupling electronics 803 may be the same coupling electronics described above with respect to FIGS. 8 and 9A-9C, and hence like reference numbers are given to like components and further description is dispensed with.

As appreciated by FIGS. 9A-9C and 10, the two parallel conductors comprising the loop portion of an RF coil may each be continuous conductors, as illustrated in FIG. 10, or one or both of the conductors may be non-continuous, as illustrated in FIGS. 9A-9C. For example, both conductors shown in FIGS. 9A-9C may include cuts, resulting in each conductor being comprised of two segments. The resulting space between conductor segments may be filled with the dielectric material that encapsulates and surrounds the conductors. The two cuts may be positioned at different locations, e.g., one cut at 135° and the other cut at 225° (relative to where the loop portion interfaces with the coupling electronics). By including discontinuous conductors, the resonance frequency of the coil may be adjusted relative to a coil that includes continuous conductors. In an example, an RF coil that includes two continuous parallel conductors encapsulated and separated by a dielectric, the resonance frequency may be a smaller, first resonance frequency. If that RF coil instead includes one discontinuous conductor (e.g., where one of the conductors is cut and filled with the dielectric material) and one continuous conductor, with all other parameters (e.g., conductor wire gauge, loop diameter, spacing between conductors, dielectric material) being the same, the resonance frequency of the RF coil may be a larger, second resonance frequency. In this way, parameters of the loop portion, including wire gauge, loop diameter, spacing between wire conductors, dielectric material selection and/or thickness, and conductor segment number and lengths, may be adjusted to tune the RF coil to a desired resonance frequency.

Figure 11:
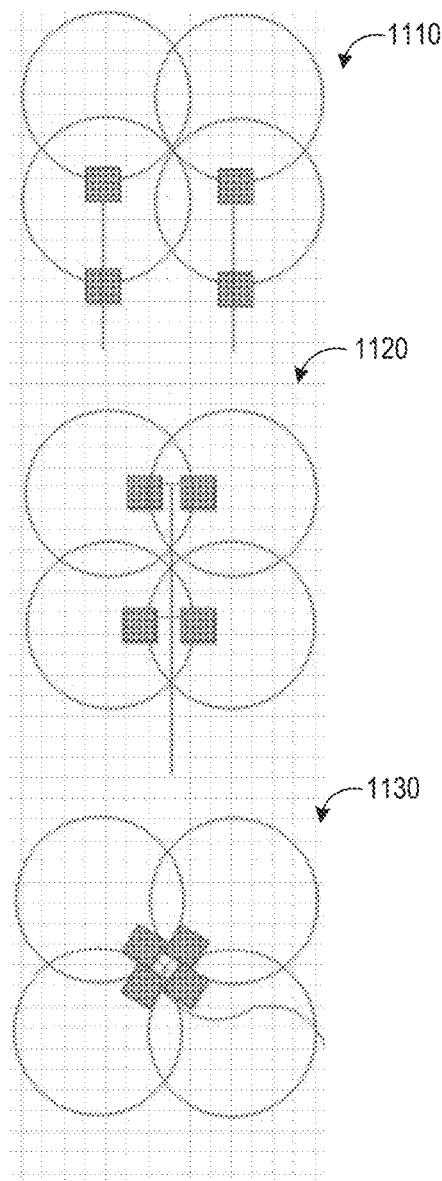
FIG. 11 shows a plurality of example RF coil configurations within an RF coil array.

The RF coils presented above with respect to FIGS. 8-10 may be utilized in order to receive MR signals during an MR imaging session. As such, the RF coils of FIGS. 8-10 may be non-limiting examples of RF coil unit 14 of FIG. 1 (and may be similar to RF coils included by first RF coil array 210, second RF coil array 212, RF coil array 300, RF coil array 400, and/or posterior RF coil array 550, described above) and may be configured to be coupled to a downstream component of the MRI system, such as a processing system. The RF coils of FIGS. 8-10 may be present in an array of RF coils having various configurations. FIG. 11, described in more detail below, illustrates various example configurations of RF coils and accompanying coil-interfacing cables, similar to the RF coils described above with respect to FIGS. 8-10.

FIG. 11 shows different arrangements for an RF coil array. First RF coil array 1110 includes a coil loop and an electronics unit coupled to each coil, and a coil-interfacing cable connected to and extending from each coupling electronics unit. Accordingly, RF coil array 1110 includes four coil loops, four electronics units, and four coil-interfacing cables. Second RF coil array 1120 includes a separate electronics unit for each coil loop, with each electronics unit coupled to a respective coil-interfacing cable. Array 1120 includes four coil loops, four electronics units, and four coil-interfacing cables that are bundled together in a single grouping of four coil-interfacing cables, and may be referred to as an integrated balun cable harness. For example, the two coil-interfacing cables coupled to the two top electronics units are bundled together, and they are bundled with two interfacing cables from the two bottom electronics units. Third RF coil array 1130 includes a separate electronics unit for each coil loop, with each electronics unit coupled to a respective coil-interfacing cable. Array 1130 includes four coil loops, four electronics units, and four coil-interfacing cables that are bundled together in a single grouping of four coil-interfacing cables, and may be referred to as an integrated balun cable harness. For example, each coil-interfacing cable coupled to a respective electronics unit may combine into one overall coil-interfacing cable, also referred to as a cable assembly.

The individual coupling electronics units may be housed in a common electronics housing in some examples. Each coil loop of the coil array may have respective coupling electronics unit (e.g., a decoupling circuit, impedance inverter circuit, and pre-amplifier) housed in the housing. In some examples, the common electronics housing may be detachable from the coil loop or RF coil array. In particular, if the individual coupling electronics are configured as in the RF coil array 1130 of FIG. 11, the electronics may be placed in a separable assembly and disconnected from the RF coil array. A connector interface could be placed at, for example, the junctions between the conductor loop portions (e.g., the drive ends described above) and the coupling electronics for each individual coupling electronics unit.

The wire conductors and coil loops used in the RF coil or RF coil array may be manufactured in any suitable manner to get the desired resonance frequency for a desired RF coil application. The desired wire gauge, such as 28 or 30 American Wire Gauge (AWG) or any other desired wire gauge may be paired with a parallel wire of the same gauge and encapsulated with a dielectric material using an extrusion process or a three-dimensional (3D) printing or additive manufacturing process. This manufacturing process may be environmentally friendly with low waste and low-cost.

Thus, the RF coil described herein includes a twin lead wire conductor loop encapsulated in a pTFE dielectric that may have no cuts or with at least one cut in at least one of the two parallel wire conductors and a miniaturized coupling electronics PCB coupled to each coil loop (e.g., very small coupling electronics PCB approximately the sizer of 2 cm$^2$ or smaller). The PCBs may be protected with a conformal coating or an encapsulation resin. In doing so, traditional components are eliminated and capacitance is "built in" the integrated capacitor (INCA) coil loops. Interactions between coil elements are reduced or eliminated. The coil loops are adaptable to a broad range of MR operating frequencies by changing the gauge of wire used, spacing between wires, loop diameters, loop shapes, and the number and placement of cuts in the wires.

The coil loops are transparent in PET/MR applications, aiding dose management and signal-to-noise ratios (SNR). The miniaturized coupling electronics PCB includes decoupling circuitry, impedance inverter circuitry with impedance matching circuitry and an input balun, and a pre-amplifier. The pre-amplifier sets new standards in coil array applications for lowest noise, robustness, and transparency. The pre-amplifier provides active noise cancelling to reduce current noise, boost linearity, and improve tolerance to varying coil loading conditions. Additionally, as explained in more detail below, a cable harness with baluns for coupling each of the miniaturized coupling electronics PCBs to the RF coil array connector that interfaces with the MRI system may be provided.

The RF coil described herein is exceptionally lightweight, and may weigh less than 10 grams per coil element versus 45 grams per coil element with General Electric Company's Geometry Embracing Method (GEM) suite of flexible RF coil arrays. For example, a 16-channel RF coil array according to the disclosure may weigh less than 0.5 kg. The RF coil described herein is exceptionally flexible and durable as the coil is extremely simple with very few rigid components to damage and allowing floating overlaps. The RF coil described herein is exceptionally low cost, e.g., greater than a ten times reduction from current technology. For example, a 16-channel RF coil array could be comprised of components and materials of less than $50. The RF coil described herein does not preclude current packaging or emerging technologies and could be implemented in RF coil arrays that do not need to be packaged or attached to a former, or implemented in RF coil arrays that are attached to flexible formers as flexible RF coil arrays or attached to rigid formers as rigid RF coil arrays.

The combination of an INCA coil loop and associated coupling electronics is a single coil element, which is functionally independent and electrically immune to its surrounding environment or neighboring coil elements. As a result, the RF coil described herein performs equally well in low and high-density coil array applications. The exceptional isolation between coil elements allows the overlap between coil elements to be maximized without degrading performance across coil elements. This allows for a higher density of coil elements than is possible with traditional RF coil array designs.

In some examples, the RF coils included by the first RF coil array 210, second RF coil array 212, RF coil array 300, RF coil array 400, and/or posterior RF coil array 550 (as described above) may be positioned in a relative arrangement similar to the configurations shown by FIG. 11. For example, the RF coils included by the RF coil array 300 may be electrically coupled together as one or more sets (e.g., sub-arrays) of RF coils, and the one or more sets may include the RF coils in arrangements similar to those shown by FIG. 11 (e.g., array 1110, array 1120, and/or array 1130).

Figure 12:
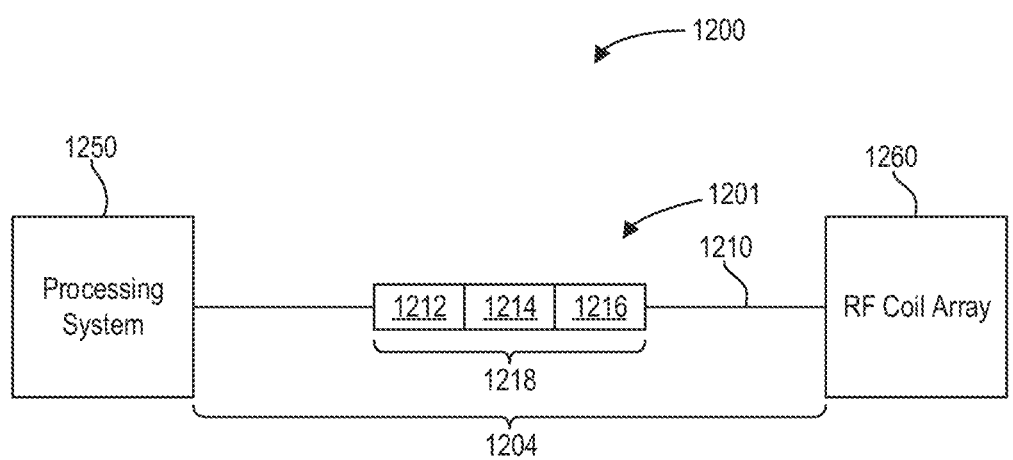
FIG. 12 schematically shows an example RF coil array interfacing cable including a plurality of continuous and/or contiguous common mode traps positioned between a processing system and an RF coil array of a MRI system.

FIG. 12 illustrates a block schematic diagram of a continuous common mode trap assembly 1200 formed in accordance with various embodiments. The common mode trap assembly 1200 may be configured as a transmission cable 1201 configured for transmission of signals between a processing system 1250 and an RF coil array of an MRI system (e.g., RF coil array 300, RF coil array 400, or posterior RF coil array 550). Transmission cable 1201 is a non-limiting example of an RF coil array interfacing cable 812, processing system 1250 is a non-limiting example of controller unit 810, and RF coil array 1260 is a non-limiting example of a plurality of RF coils 802 and coupling electronics 803 of FIG. 8.

In the illustrated embodiment, the transmission cable 1201 (or RF coil array interfacing cable) includes a central conductor 1210 and plural common mode traps 1212, 1214, 1216. It may be noted that, while the common mode traps 1212, 1214, and 1216 are depicted as distinct from the central conductor 1210, in some embodiments, the common mode traps 1212, 1214, 1216 may be integrally formed with or as a part of the central conductor 1210.

The central conductor 1210 in the illustrated embodiment has a length 1204, and is configured to transmit a signal between the RF coil array 1260 and at least one processor of an MRI system (e.g., processing system 1250). The central conductor 1210 may include one or more of a ribbon conductor, a wire, or a coaxial cable bundle, for example. The length 1204 of the depicted central conductor 1210 extends from a first end of the central conductor 1210 (which is coupled to the processing system 1250) to a second end of the central conductor 1210 (which is coupled to the RF coil array 1260). In some embodiments, the central conductor may pass through a central opening of the common mode traps 1212, 1214, 1216.

The depicted common mode traps 1212, 1214, 1216 (which may be understood as cooperating to form a common mode trap unit 1218), as seen in FIG. 12, extend along at least a portion of the length 1204 of the central conductor 1210. In the illustrated embodiment, common mode traps 1212, 1214, 1216 do not extend along the entire length 1204. However, in other embodiments, the common mode traps 1212, 1214, 1216 may extend along the entire length 1204, or substantially along the entire length 1204 (e.g., along the entire length 1204 except for portions at the end configured to couple, for example, to a processor or RF coil array). The common mode traps 1212, 1214, 1216 are disposed contiguously. As seen in FIG. 12, each of the common mode traps 1212, 1214, 1216 is disposed contiguously to at least one other of the common mode traps 1212, 1214, 1216. As used herein, contiguous may be understood as including components or aspects that are immediately next to or in contact with each other. For example, contiguous components may be abutting one another. It may be noted that in practice, small or insubstantial gaps may be between contiguous components in some embodiments. In some embodiments, an insubstantial gap (or conductor length) may be understood as being less than 1/40th of a wavelength of a transmit frequency in free space. In some embodiments, an insubstantial gap (or conductor length) may be understood as being two centimeters or less. Contiguous common mode traps, for example, have no (or insubstantial) intervening gaps or conductors therebetween that may be susceptible to induction of current from a magnetic field without mitigation provided by a common mode trap.

For example, as depicted in FIG. 12, the common mode trap 1212 is contiguous to the common mode trap 1214, the common mode trap 1214 is contiguous to the common mode trap 1212 and the common mode trap 1216 (and is interposed between the common mode trap 1212 and the common mode trap 1216), and the common mode trap 1216 is contiguous to the common mode trap 1214. Each of the common mode traps 1212, 1214, 1216 are configured to provide an impedance to the receive transmitter driven currents of an MRI system. The common mode traps 1212, 1214, 1216 in various embodiments provide high common mode impedances. Each common mode trap 1212, 1214, 1216, for example, may include a resonant circuit and/or one or more resonant components to provide a desired impedance at or near a desired frequency or within a target frequency range. It may be noted that the common mode traps 1212, 1214, 1216 and/or common mode trap unit 1218 may also be referred to as chokes or baluns by those skilled in the art.

In contrast to systems having separated discrete common mode traps with spaces therebetween, various embodiments (e.g., the common mode trap assembly 1200) have a portion over which common mode traps extend continuously and/or contiguously, so that there are no locations along the portion for which a common mode trap is not provided. Accordingly, difficulties in selecting or achieving particular placement locations of common mode traps may be reduced or eliminated, as all locations of interest may be included within the continuous and/or contiguous common mode trap. In various embodiments, a continuous trap portion (e.g., common mode trap unit 1218) may extend along a length or portion thereof of a transmission cable.

The continuous mode trap portion may be formed of contiguously-joined individual common mode traps or trap sections (e.g., common mode traps 1212, 1214, 1216). Further, contiguous common mode traps may be employed in various embodiments to at least one of lower the interaction with coil elements, distribute heat over a larger area (e.g., to prevent hot spots), or help ensure that blocking is located at desired or required positions. Further, contiguous common mode traps may be employed in various embodiments to help distribute voltage over a larger area. Additionally, continuous and/or contiguous common mode traps in various embodiments provide flexibility. For example, in some embodiments, common mode traps may be formed using a continuous length of conductor(s) (e.g., outer conductors wrapped about a central conductor) or otherwise organized as integrally formed contiguous sections. In various embodiments, the use of contiguous and/or continuous common mode traps (e.g., formed in a cylinder) provide for a range of flexibility over which flexing of the assembly does not substantially change the resonant frequency of the structure, or over which the assembly remains on frequency as it is flexed.

It may be noted that the individual common mode traps or sections (e.g., common mode traps 1212, 1214, 1216) in various embodiments may be constructed or formed generally similarly to each other (e.g., each trap may be a section of a length of tapered wound coils), but each individual trap or section may be configured slightly differently than other traps or sections. For example, in some embodiments, each common mode trap 1212, 1214, 1216 is tuned independently. Accordingly, each common mode trap 1212, 1214, 1216 may have a resonant frequency that differs from other common mode traps of the same common mode trap assembly 1200.

Alternatively or additionally, each common mode trap may be tuned to have a resonant frequency near an operating frequency of the MRI system. As used herein, a common mode trap may be understood as having a resonant frequency near an operating frequency when the resonant frequency defines or corresponds to a band that includes the operating frequency, or when the resonant frequency is close enough to the operating frequency to provide on-frequency blocking, or to provide a blocking impedance at the operating frequency.

Further additionally or alternatively, each common mode trap may be tuned to have a resonant frequency below an operating frequency of the MRI system (or each common mode trap may be tuned to have resonant frequency above an operating frequency of the MRI system). With each trap having a frequency below (or alternatively, with each trap having a frequency above) the operating frequency, the risk of any of the traps canceling each other out (e.g., due to one trap having a frequency above the operating frequency and a different trap having a frequency below the operating frequency) may be eliminated or reduced. As another example, each common mode trap may be tuned to a particular band to provide a broadband common mode trap assembly.

In various embodiments, the common mode traps may have a two-dimensional (2D) or three-dimensional (3D) butterfly configuration to counteract magnetic field coupling and/or local distortions.

Figure 13:
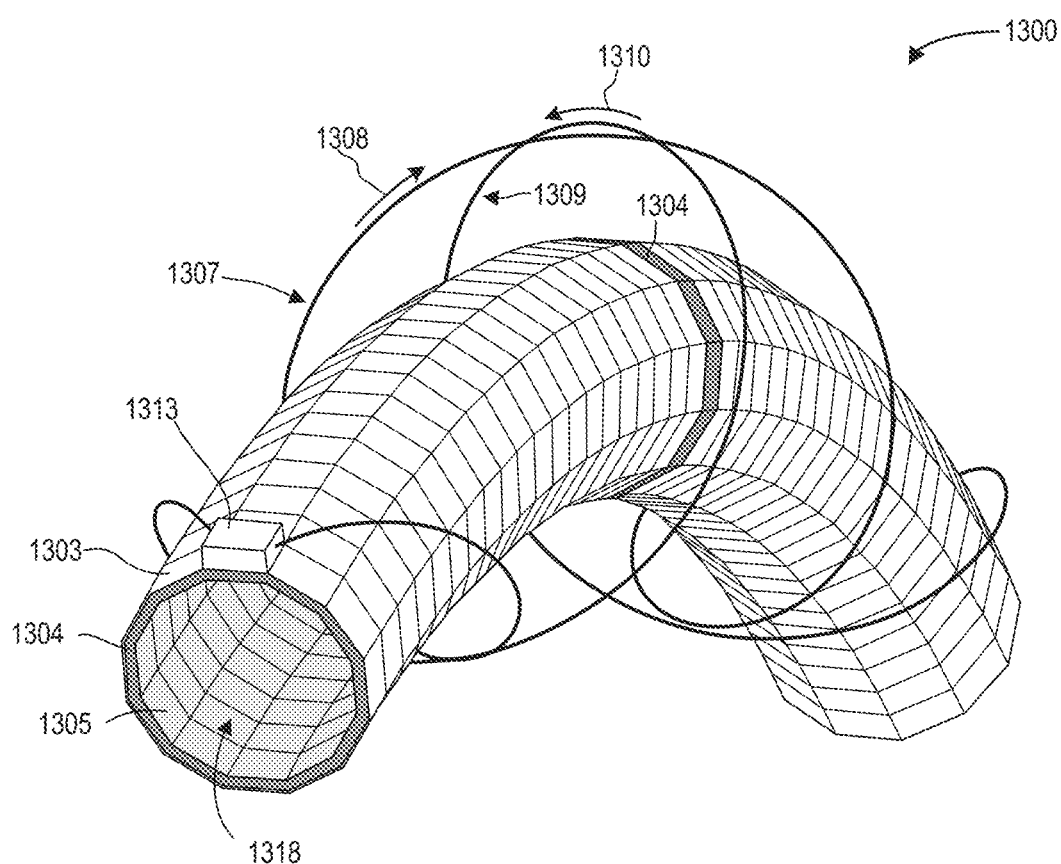
FIGS. 13 and 14 schematically show example RF coil array interfacing cables including a plurality of continuous and/or contiguous common mode traps.

FIG. 13 is a perspective view of an RF coil array interfacing cable 1300 including a plurality of continuous and/or contiguous common mode traps according to an embodiment of the disclosure. The RF coil array interfacing cable 1300 includes an outer sleeve or shield 1303, a dielectric spacer 1304, an inner sleeve 1305, a first common mode trap conductor 1307, and a second common mode trap conductor 1309.

The first common mode trap conductor 1307 is wrapped in a spiral about the dielectric spacer 1304, or wrapped in a spiral at a tapering distance from a central conductor (not shown) disposed within the bore 1318 of the RF coil array interfacing cable 1300, in a first direction 1308. Further, the second common mode trap conductor 1309 is wrapped in a spiral about the dielectric spacer 1304, or wrapped in a spiral at a tapering distance from the central conductor disposed within the bore 1318, in a second direction 1310 that is opposite to the first direction 1308. In the illustrated embodiment, the first direction 1308 is clockwise and the second direction 1310 is counter-clockwise.

The conductors 1307 and 1309 of the RF coil array interfacing cable 1300 may comprise electrically-conductive material (e.g., metal) and may be shaped as ribbons, wires, and/or cables, for example. In some embodiments, the counterwound or outer conductors 1307 and 1309 may serve as a return path for a current passing through the central conductor. Further, in various embodiments, the counterwound conductors 1307 and 1309 may cross each other orthogonally (e.g., a center line or path defined by the first common mode trap conductor 1307 is perpendicular to a center line or path defined by the second common mode trap conductor 1309 as the common mode trap conductors cross paths) to eliminate, minimize, or reduce coupling between the common mode trap conductors.

It may be further noted that in various embodiments the first common mode trap conductor 1307 and the second common mode trap conductor 1309 are loosely wrapped about the dielectric spacer 1304 to provide flexibility and/or to reduce any binding, coupling, or variation in inductance when the RF coil array interfacing cable 1300 is bent or flexed. It may be noted that the looseness or tightness of the counterwound outer conductors may vary by application (e.g., based on the relative sizes of the conductors and dielectric spacer, the amount of bending or flexing that is desired for the common mode trap, or the like). Generally, the outer or counterwound conductors should be tight enough so that they remain in the same general orientation about the dielectric spacer 1304, but loose enough to allow a sufficient amount of slack or movement during bending or flexing of the RF coil array interfacing cable 1300 to avoid, minimize, or reduce coupling or binding of the counterwound outer conductors.

In the illustrated embodiment, the outer shielding 1303 is discontinuous in the middle of the RF coil array interfacing cable 1300 to expose a portion of the dielectric spacer 1304 which in some embodiments is provided along the entire length of the RF coil array interfacing cable 1300. The dielectric spacer 1304, may be comprised, as a non-limiting example, of Teflon or another dielectric material. The dielectric spacer 1304 functions as a capacitor and thus may be tuned or configured to provide a desired resonance. It should be appreciated that other configurations for providing capacitance to the RF coil array interfacing cable 1300 are possible, and that the illustrated configurations are exemplary and non-limiting. For example, discrete capacitors may alternatively be provided to the RF coil array interfacing cable 1300.

Further, the RF coil array interfacing cable 1300 includes a first post 1313 and a second post (not shown) to which the first common mode trap conductor 1307 and the second common mode trap conductor 1309 are fixed. To that end, the first post 1313 and the second post are positioned at the opposite ends of the common mode trap, and are fixed to the outer shielding 1303. The first post 1313 and the second post ensure that the first and second common mode trap conductors 1307 and 1309 are positioned close to the outer shielding 1303 at the ends of the RF coil array interfacing cable 1300, thereby providing a tapered butterfly configuration of the counterwound conductors as described further herein.

The tapered butterfly configuration includes a first loop formed by the first common mode trap conductor 1307 and a second loop formed by the second common mode trap conductor 1309, arranged so that an induced current (a current induced due to a magnetic field) in the first loop 1307 and an induced current in the second loop 1309 cancel each other out. For example, if the field is uniform and the first loop 1307 and the second loop 1309 have equal areas, the resulting net current will be zero. The tapered cylindrical arrangement of the loops 1307 and 1309 provide improved flexibility and consistency of resonant frequency during flexing relative to two-dimensional arrangements conventionally used in common mode traps.

Generally, a tapered butterfly configuration as used herein may be used to refer to a conductor configuration that is flux cancelling, for example including at least two similarly sized opposed loops that are symmetrically disposed about at least one axis and are arranged such that currents induced in each loop (or group of loops) by a magnetic field tends to cancel out currents induced in at least one other loop (or group of loops). For example, with reference to FIG. 12, in some embodiments, counterwound conductors (e.g., conductors wound about a central member and/or axis in opposing spiral directions) may be spaced a distance radially from the central conductor 1210 to form the common mode traps 1212, 1214, 1216. As depicted in FIG. 13, the radial distance may be tapered towards the end of the common mode traps to reduce or altogether eliminate fringe effects. In this way, the common mode traps 1212, 1214, 1216 may be continuously or contiguously positioned without substantial gaps therebetween.

Figure 14:
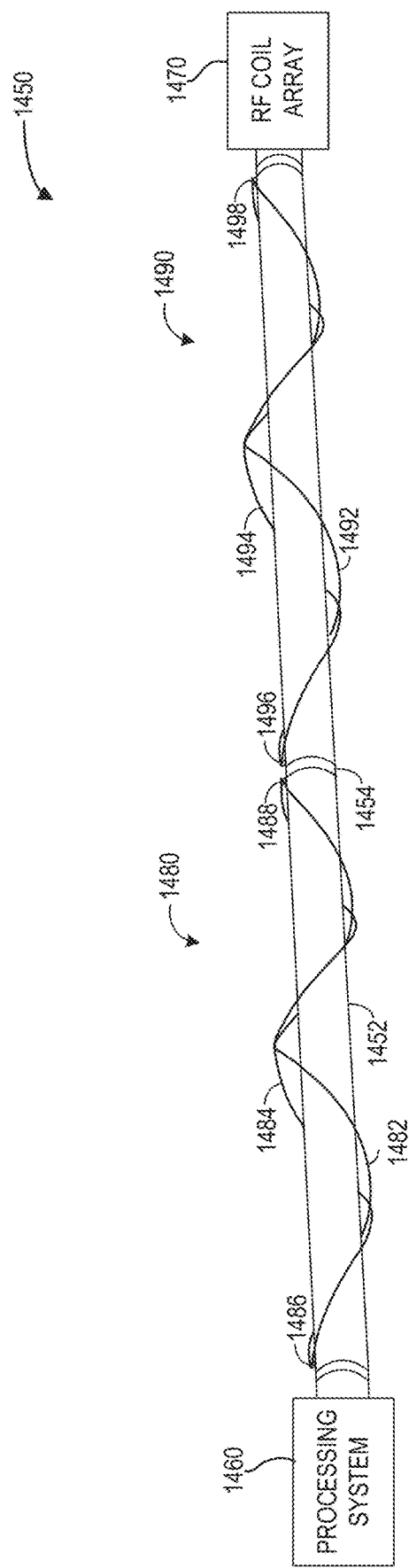

The tapered spiral configuration of the common mode trap conductors described herein above is particularly advantageous when multiple common mode trap conductors are contiguously disposed in a common mode trap assembly. As an illustrative example, FIG. 14 is a perspective view of an RF coil array interfacing cable 1450 including a plurality of continuous and/or contiguous common mode traps coupling an RF coil 1470 to a processing system 1460. RF coil array interfacing cable 1450 includes a first common mode trap 1480 and a second common mode trap 1490 positioned adjacent to each other on a central conductor 1452.

The first common mode trap 1480 includes a first common mode trap conductor 1482 and a second common mode trap conductor 1484 counterwound in a tapered spiral configuration. To that end, the first and second conductors 1482 and 1484 are fixed to posts 1486 and 1488. It should be noted that the posts 1486 and 1488 are aligned on a same side of the common mode trap 1480.

Similarly, the second common mode trap 1490 includes a third common mode trap conductor 1492 and a fourth common mode trap conductor 1494 counterwound in a tapered spiral configuration and fixed to posts 1496 and 1498. It should be noted that the posts 1496 and 1498 are aligned on a same side of the common mode trap 1490.

As depicted, the common mode traps 1480 and 1490 are separated by a distance, thereby exposing the central conductor 1452 in the gap 1454 between the common mode traps. Due to the tapering spiral configuration of the common mode trap conductors of the common mode traps, the gap 1454 can be minimized or altogether eliminated in order to increase the density of common mode traps in a common mode trap assembly without loss of impedance functions of the common mode traps. That is, the distance can be made arbitrarily small such that the common mode traps are in contact, given the tapered spiral configuration.

It should be appreciated that while the RF coil array interfacing cable 1450 includes two common mode traps 1480 and 1490, in practice an RF coil array interfacing cable may include more than two common mode traps.

Further, the common mode traps 1480 and 1490 of the RF coil array interfacing cable 1450 are aligned such that the posts 1486, 1488, 1496, and 1498 are aligned on a same side of the RF coil array interfacing cable. However, in examples where cross-talk between the common mode traps may be possible, for example if the tapering of the counterwound conductors is more severe or steep, the common mode traps may be rotated with respect to one another to further reduce fringe effects and/or cross-talk between the traps.

Additionally, other common mode trap or balun configurations are possible. For example, the exterior shielding of each common mode trap may be trimmed such that the common mode traps can be overlapped or interleaved, thus increasing the density of the common mode traps.

In some examples, the RF coils described above with reference to FIGS. 8-14 may have one of a plurality of different resonant frequencies, and/or one or more RF coils of the RF coil arrays described above may have different resonant frequencies relative to one or more other RF coils. In one example, a gauge of the loop portion of the RF coils, a spacing between wires of the RF coils, a diameter of the loop portion, and/or a number and/or arrangement of cuts in the wires of the RF coils may alter the resonant frequency of the RF coils. RF coils having an appropriate resonant frequency may be selected for various MRI systems (e.g., systems in which the static magnetic field has a specified magnitude, such as 1.5 Tesla, 3 Tesla, 7 Tesla, etc.) and/or may be selected according to an anatomical feature to be imaged by the MRI system (e.g., RF coils for imaging a posterior of the patient may have a different resonant frequency than RF coils for imaging an anterior of the patient).

By configuring the RF coil array to include flexible RF coils embedded within the flexible inner layer, the RF coil array may conform to the body of the patient and the RF coils may be positioned closer to the body of the patient. For example, gases may be removed from the outer chamber of the shell of the RF coil array in order to compress the loose fill disposed within the outer chamber against the body of the patient. A technical effect of compressing the loose fill against the body of the patient is to increase the rigidity of the RF coil array as the RF coil array conforms to the body of the patient. In this way, the RF coil array may be maintained in contact with the body of the patient and conform to the shape of the body. Conforming the RF coil array to the body of the patient reduces a distance of the RF coils from the body. The technical effect of reducing the distance of the RF coils from the body is to increase a signal-receiving quality of the RF coils and increase an imaging quality of the RF coil array.

In one embodiment, a system comprises: a radio frequency (RF) coil array for a magnetic resonance imaging (MRI) system, including: a flexible shell including an inner layer; and a plurality of flexible RF coils embedded within the inner layer, with each RF coil of the plurality of RF coils including at least two distributed capacitance wire conductors. In a first example of the system, at least two distributed capacitance wire conductors includes a loop portion comprising two parallel, distributed capacitance wire conductors encapsulated and separated by a dielectric material; and wherein each RF coil of the plurality of flexible RF coils includes: a coupling electronics portion including a preamplifier; and a coil-interfacing cable extending between the coupling electronics portion and an interfacing connector of the RF coil array. A second example of the system optionally includes the first example, and further includes a sealed outer chamber that is fluidly coupleable to a gas source via a valve of the flexible shell. A third example of the system optionally includes one or both of the first and second examples, and further includes wherein the inner layer includes first and second sheets of a flexible fabric material, and wherein the plurality of RF coils is disposed between the first and second sheets. A fourth example of the system optionally includes one or more or each of the first through third examples, and further includes a loose fill disposed within the outer chamber, the loose fill including a plurality of particles movable relative to each other within the outer chamber. A fifth example of the system optionally includes one or more or each of the first through fourth examples, and further includes wherein the flexible shell includes a plurality of extensions, with each extension of the plurality of extensions is adapted to receive an extremity of a patient, and wherein the outer chamber and plurality of flexible RF coils extend into each extension. A sixth example of the system optionally includes one or more or each of the first through fifth examples, and further includes wherein the flexible shell includes an opening shaped to encircle a face of a patient. A seventh example of the system optionally includes one or more or each of the first through sixth examples, and further includes wherein the RF coil array is an anterior RF coil array coupleable to a posterior RF coil array, the posterior RF coil array including: a flexible, second shell including a second inner layer; and a second plurality of flexible RF coils embedded within the second inner layer, with each RF coil of the second plurality of RF coils including at least two distributed capacitance wire conductors. An eighth example of the system optionally includes one or more or each of the first through seventh examples, and further includes wherein the anterior RF coil array is adapted to be positioned in contact with the front of a body of a patient, and the posterior RF coil array is adapted to be positioned in contact with the rear of the body of the patient. A ninth example of the system optionally includes one or more or each of the first through eighth examples, and further includes wherein the at least two distributed capacitance wire conductors includes a loop portion comprising two parallel, distributed capacitance wire conductors encapsulated and separated by a dielectric material; and wherein each RF coil of the plurality of flexible RF coils includes: a coupling electronics portion; and a coil-interfacing cable extending between the coupling electronics portion and an interfacing connector of the RF coil array.

In one embodiment, a method comprises: positioning inner surfaces of a flexible shell of a radio frequency (RF) coil array in contact with a body of a patient; flowing gases through a valve of the flexible shell to conform the inner surfaces of the flexible shell against the body; energizing a magnetic resonance imaging (MRI) system to produce a magnetic field in a region of the RF coil array; and receiving magnetic resonance (MR) signals at a processing system of the MRI system from a plurality of flexible RF coils disposed within the flexible shell, the plurality of flexible RF coils including at least two distributed capacitance wire conductors. In a first example of the method, the method further comprises processing the received MR signals from the plurality of flexible RF coils via the processing system and displaying an image of the body of the patient on a graphical display device based on the processed signals. A second example of the method optionally includes the first example, and further includes wherein positioning the inner surfaces in contact with the body of the patient and flowing gases through the valve of the flexible shell conforms the plurality of flexible RF coils to the body of the patient, where each RF coil of the plurality of flexible RF coils includes a loop portion comprising at least two parallel, distributed capacitance wire conductors encapsulated and separated by a dielectric material, a coupling electronics portion including, and a coil-interfacing cable extending between the coupling electronics portion and an interfacing connector of the RF coil array. A third example of the method optionally includes one or both of the first and second examples, and further includes wherein receiving the MR signals from the plurality of RF coils includes selecting one or more sections of the plurality of RF coils via a user interface device of the MRI system, and wherein the MR signals are received only from the selected one or more sections. A fourth example of the method optionally includes one or more or each of the first through third examples, and further includes wherein flowing gases through the valve includes flowing gases into an outer chamber of the RF coil array to expand the outer chamber. A fifth example of the method optionally includes one or more or each of the first through fourth examples, and further includes wherein flowing gases through the valve includes flowing gases out of an outer chamber of the RF coil array to atmosphere. A sixth example of the method optionally includes one or more or each of the first through fifth examples, and further includes wherein flowing gases out of the outer chamber compresses a loose fill disposed within the outer chamber and conforms the RF coil array to the body of the patient. A seventh example of the method optionally includes one or more or each of the first through sixth examples, and further includes wherein compressing the loose fill within the outer chamber increases a rigidity of the RF coil array.

In another embodiment, a system for a magnetic resonance imaging (MRI) system comprises: an anterior radio frequency (RF) coil array including a first plurality of flexible RF coils, a sealed, first outer chamber having a first loose fill disposed therein, and an opening shaped to encircle a face of a patient; a posterior RF coil array including a second plurality of flexible RF coils and a sealed, second outer chamber having a second loose fill disposed therein, the posterior RF coil array removably coupleable to the anterior RF coil array; and where each RF coil of the first and second pluralities of RF coils includes: a loop portion comprising at least two parallel, distributed capacitance wire conductors encapsulated and separated by a dielectric material; a coupling electronics portion including; and a coil-interfacing cable extending between the coupling electronics portion and an interfacing connector of the RF coil array. In a first example of the system, the anterior RF coil array includes a first valve fluidly coupleable to a gas source, the first valve opening to the first outer chamber, the posterior RF coil includes a second valve fluidly coupleable to the gas source, the second valve opening to the second outer chamber, and the first outer chamber is fluidly isolated from the second outer chamber.

FIGS. 3-6 show example configurations with relative positioning of the various components. If shown directly contacting each other, or directly coupled, then such elements may be referred to as directly contacting or directly coupled, respectively, at least in one example. Similarly, elements shown contiguous or adjacent to one another may be contiguous or adjacent to each other, respectively, at least in one example. As an example, components laying in contact with each other may be referred to as in direct contact. As another example, elements positioned apart from each other with only a space there-between and no other components may be referred to as such, in at least one example. As yet another example, elements shown above/below one another, at opposite sides to one another, or to the left/right of one another may be referred to as such, relative to one another. Further, as shown in the figures, a topmost element or point of element may be referred to as a "top" of the component and a bottommost element or point of the element may be referred to as a "bottom" of the component, in at least one example. As used herein, top/bottom, upper/lower, above/below, may be relative to a vertical axis of the figures and used to describe positioning of elements of the figures relative to one another. As such, elements shown above other elements are positioned vertically above the other elements, in one example. As yet another example, shapes of the elements depicted within the figures may be referred to as having those shapes (e.g., such as being circular, straight, planar, curved, rounded, chamfered, angled, or the like). Further, elements shown intersecting one another may be referred to as intersecting elements or intersecting one another, in at least one example. Further still, an element shown within another element or shown outside of another element may be referred as such, in one example.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property. The terms "including" and "in which" are used as the plain-language equivalents of the respective terms "comprising" and "wherein." Moreover, the terms "first," "second," and "third," etc. are used merely as labels, and are not intended to impose numerical requirements or a particular positional order on their objects.

This written description uses examples to disclose the invention, including the best mode, and also to enable a person of ordinary skill in the relevant art to practice the invention, including making and using any devices or systems and performing any incorporated methods. The patentable scope of the invention is defined by the claims, and may include other examples that occur to those of ordinary skill in the art. Such other examples are intended to be within the scope of the claims if they have structural elements that do not differ from the literal language of the claims, or if they include equivalent structural elements with insubstantial differences from the literal languages of the claims.

The invention claimed is:

1. A radio frequency (RF) coil array assembly for a magnetic resonance imaging (Mill) system, comprising:
    a flexible shell including an inner layer, wherein the flexible shell refers to a bendable shell; and
    a plurality of flexible RF coils embedded within the inner layer, wherein each RF coil of the plurality of flexible RF coils includes two distributed capacitance wire conductors;
    wherein the plurality of flexible RF coils refers to a plurality of bendable RF coils;
    wherein the RF coil array assembly includes an anterior RF coil array and a posterior RF coil array coupled to each other; and
    wherein each of the anterior RF coil array and the posterior RF coil array includes a sealed outer chamber with a loose fill disposed therein, the loose fill including a plurality of particles movable relative to each other within the outer chamber.

2. The RF coil array assembly of claim 1, wherein the two distributed capacitance wire conductors include a loop portion comprising two wire conductors encapsulated and separated by a dielectric material; and wherein each RF coil of the plurality of flexible RF coils further includes:
    a coupling electronics portion including a pre-amplifier; and
    a coil-interfacing cable extending between the coupling electronics portion and an interfacing connector of the RF coil array.

3. The RF coil array assembly of claim 2, wherein the coupling electronics of each RF coil further includes a decoupling circuit configured to decouple the respective RF coil during a transmit operation of the Mill system.

4. The RF coil array assembly of claim 1, wherein at least one of the sealed outer chambers is fluidly coupled to a gas source via a valve of the flexible shell.

5. The RF coil array assembly of claim 4, wherein the flexible shell includes a plurality of extensions, wherein each extension of the plurality of extensions is adapted to receive an extremity of a patient, and wherein at least one of the outer chambers extends into each extension.

6. The RF coil array assembly of claim 1, wherein the inner layer includes a fabric material, and wherein the plurality of RF coils is embedded in the fabric material.

7. The RF coil array assembly of claim 1, wherein the flexible shell includes an opening shaped to encircle a face of a patient.

8. The RF coil array assembly of claim 1, wherein the anterior RF coil array is adapted to be positioned in contact with the front of a body of a patient, and the posterior RF coil array is adapted to be positioned in contact with the rear of the body of the patient.

9. A method, comprising:
    positioning inner surfaces of a bendable shell of a radio frequency (RF) coil array assembly in contact with a body of a patient;
    flowing gas through a valve of the bendable shell to conform the inner surfaces of the bendable shell against the body;
    operating a magnetic resonance imaging (MRI) system to scan the body of the patient in a region enclosed by the RF coil array assembly; and receiving magnetic resonance (MR) signals at a processing system of the MRI system from at least some of a plurality of bendable RF coils disposed within the bendable shell, each RF coil of the plurality of bendable RF coils including two distributed capacitance wire conductors;

wherein the RF coil array assembly includes an anterior RF coil array and a posterior RF coil array coupled to each other; and wherein each of the anterior RF coil array and the posterior RF coil array includes a sealed outer chamber with a loose fill disposed therein, the loose fill including a plurality of particles movable relative to each other within the outer chamber.

10. The method of claim 9, further comprising:

processing, by the processing system, the received MR signals; and displaying an image of the body of the patient on a graphical display device based on the processed signals.

11. The method of claim 9, further comprising selecting one or more sections of the plurality of bendable RF coils, wherein the MR signals are received only from the selected one or more sections.

12. The method of claim 9, wherein flowing gas through the valve includes flowing gas into at least one of the sealed outer chambers to expand the respective sealed outer chamber.

13. The method of claim 9, wherein flowing gas through the valve includes flowing gas out of at least one of the outer chambers to atmosphere.

14. The method of claim 13, wherein the loose fill disposed within the outer chamber is compressed to conform the inner surfaces to the body of the patient when gas is flowed out of the outer chamber to atmosphere.

15. A radio frequency (RF) coil array assembly for a magnetic resonance imaging (Mill) system, comprising:

an anterior RF coil array including a first plurality of bendable RF coils, a first sealed outer chamber with a first loose fill disposed therein, and an opening shaped to encircle a face of a patient, wherein the first loose fill includes a plurality of particles movable relative to each other within the first sealed outer chamber; and a posterior RF coil array including a second plurality of bendable RF coils and a second sealed outer chamber with a second loose fill disposed therein, the posterior RF coil array removably coupled to the anterior RF coil array, wherein the second loose fill includes a plurality of particles movable relative to each other within the second sealed outer chamber;

wherein each RF coil of the first and second pluralities of bendable RF coils includes two distributed capacitance wire conductors encapsulated and separated by a dielectric material.

16. The RF coil assembly of claim 15, wherein the anterior RF coil array includes a first valve fluidly coupled to a gas source, the first valve opening to the first outer chamber, the posterior RF coil includes a second valve fluidly coupled to the gas source, the second valve opening to the second outer chamber, and the first outer chamber is fluidly isolated from the second outer chamber.

17. The RF coil assembly of claim 15, wherein each RF coil of the first and second pluralities of bendable RF coils further includes:

a coupling electronics portion including a pre-amplifier; and a coil-interfacing cable extending between the coupling electronics portion and an interfacing connector of the RF coil array.

18. The RF coil array assembly of claim 17, wherein the coupling electronics of each RF coil further includes a decoupling circuit configured to decouple the respective RF coil during a transmit operation of the Mill system.

* * * * *